United States Patent
Palm et al.

(10) Patent No.: US 12,315,835 B2
(45) Date of Patent: May 27, 2025

(54) PRE-PACKAGED CHIP, METHOD OF MANUFACTURING A PRE-PACKAGED CHIP, SEMICONDUCTOR PACKAGE AND METHOD OF MANUFACTURING A SEMICONDUCTOR PACKAGE

(71) Applicant: Infineon Technologies AG, Neubiberg (DE)

(72) Inventors: Petteri Palm, Stein (DE); Eslam Abdelhamid, Villach (AT); Thomas Gebhard, Villach (AT); Mahadi-Ul Hassan, Regensburg (DE); Juan Sanchez, Villach (AT); Martin Henning Vielemeyer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 571 days.

(21) Appl. No.: 17/578,565

(22) Filed: Jan. 19, 2022

(65) Prior Publication Data

US 2022/0230982 A1   Jul. 21, 2022

(30) Foreign Application Priority Data

Jan. 19, 2021 (DE) .......................... 102021101010.1

(51) Int. Cl.
  *H01L 23/00* (2006.01)
  *H01L 25/00* (2006.01)
  *H01L 25/10* (2006.01)

(52) U.S. Cl.
  CPC .............. *H01L 24/20* (2013.01); *H01L 24/19* (2013.01); *H01L 25/105* (2013.01); *H01L 25/50* (2013.01);

(Continued)

(58) Field of Classification Search
None
See application file for complete search history.

(56) References Cited

U.S. PATENT DOCUMENTS

| 9,281,339 B1 | 3/2016 | Lin et al. | |
|---|---|---|---|
| 2007/0151758 A1* | 7/2007 | Dunn | H05K 1/162 |
| | | | 174/262 |

(Continued)

FOREIGN PATENT DOCUMENTS

| WO | 2013029073 A1 | 3/2013 |
|---|---|---|
| WO | 2019187400 A1 | 10/2019 |

*Primary Examiner* — Cory W Eskridge
(74) *Attorney, Agent, or Firm* — Murphy, Bilak & Homiller, PLLC

(57) ABSTRACT

A pre-packaged chip includes a chip having at least one electrical top contact at a top side of the chip and at least one electrical bottom contact at a bottom side, a first laminate layer on the top side, a second laminate layer on the bottom side, the first laminate layer and the second laminate layer being laminated together to sandwich the chip therebetween, a first metal layer on the first laminate layer and electrically contacted to the at least one electrical top contact via at least one top contact hole through the first laminate layer, and a second metal layer on the second laminate layer and electrically contacted to the at least one electrical bottom contact via at least one bottom contact hole through the second laminate layer. The pre-packaged chip is free from any contact hole extending from the first metal layer to the second metal layer.

11 Claims, 20 Drawing Sheets

(52) U.S. Cl.
CPC .. *H01L 2224/214* (2013.01); *H01L 2224/221* (2013.01)

(56) References Cited

U.S. PATENT DOCUMENTS

| | | | |
|---|---|---|---|
| 2008/0073797 A1* | 3/2008 | Kim | H01L 24/24 |
| | | | 257/E23.141 |
| 2013/0003314 A1* | 1/2013 | Igarashi | H01L 24/19 |
| | | | 29/850 |
| 2013/0127031 A1 | 5/2013 | Hosseini et al. | |
| 2015/0255380 A1* | 9/2015 | Chen | H01L 23/367 |
| | | | 361/707 |
| 2016/0050768 A1 | 2/2016 | Chen et al. | |
| 2018/0076103 A1 | 3/2018 | Jeon et al. | |
| 2019/0164865 A1 | 5/2019 | Elger et al. | |

* cited by examiner

FIG. 5A (Continued)
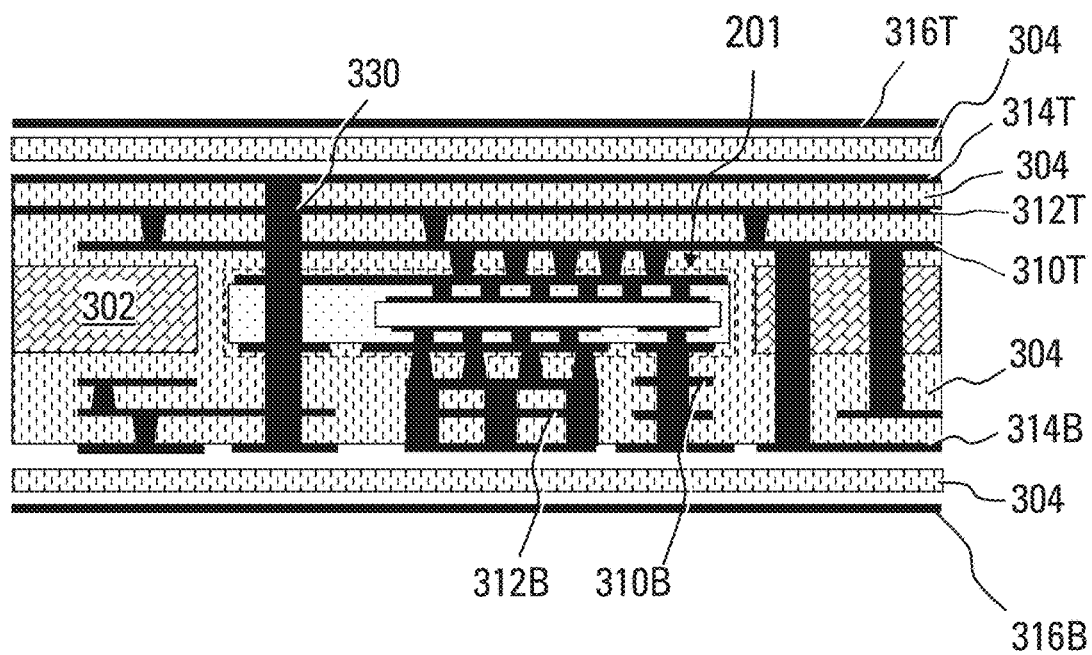
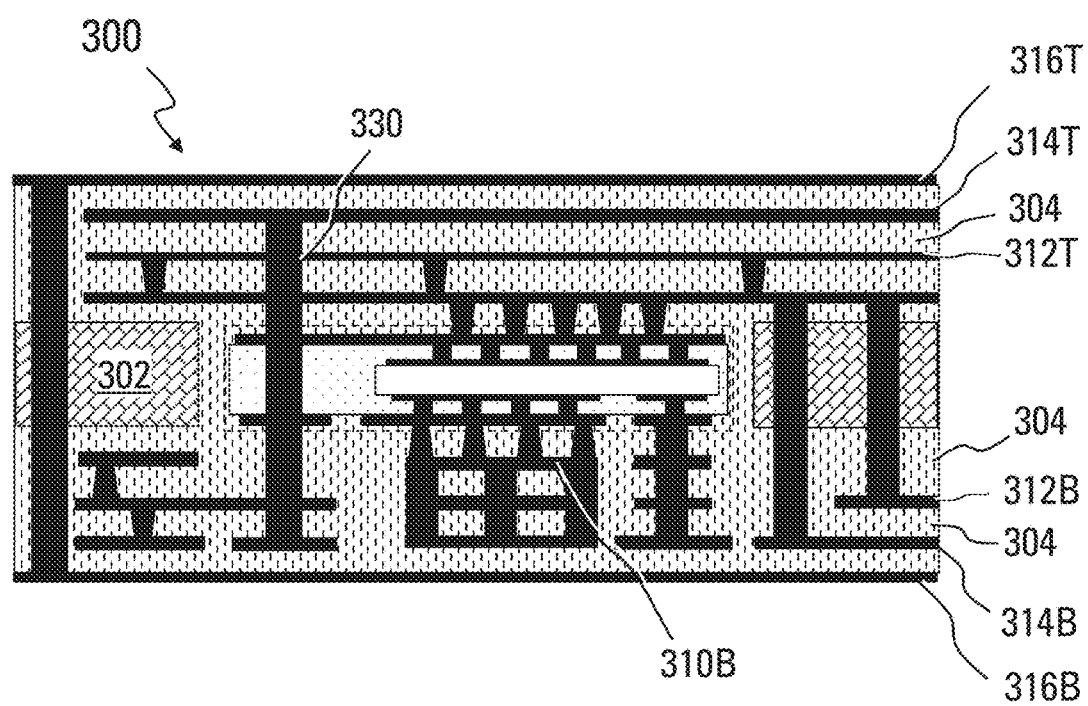

FIG. 7

| Possible process steps | Cost | design | process |
|---|---|---|---|
| • 1 core with inlay<br>• 5x lamination<br>• 5x μvia<br>• 1-5x drilling step | + | +++ | + Typical HDI build up process |
| • 1 core with inlay + 2x cores<br>• 4x lamination<br>• 3x μvia<br>• 1-6x drilling step | ++ | + | ++ |
| • 1 core with inlay + 4x cores<br>• 2-3x lamination<br>• 1x μvia<br>• 2-7x drilling step | +++ | - | +++ |
| • 1 core with inlay + 2x cores<br>• 3x lamination<br>• 3x μvia<br>• 1-5x drilling step | ++ | + | ++ |
| • 1 core with inlay + 2x cores<br>• 4x lamination<br>• 3x microvia<br>• 1-6x drilling step | ++ | + | ++ |
| • 1 core with inlay<br>• 4x lamination<br>• 4x μvia<br>• 1-4x drilling step | ++ | +++ | +++ |
| • 1 core with inlay + 2x cores<br>• 3x lamination<br>• 2x μvia<br>• 2-5x drilling step | +++ | + | +++ |
| • 1 core with inlay + 2x cores<br>• 3x lamination<br>• 2x μvia<br>• 2-5x drilling step | +++ | + | +++ |
| • 2x cores with inlay<br>• 5x lamination<br>• 4x μvia<br>• 2-4x drilling step | ++ | +++ | --- |
| • 2x cores with inlay<br>• 5x lamination<br>• 4x μvia<br>• 3-5x drilling step | ++ | + | +++ |
| • 2x cores with inlay + 2x cores<br>• 3-4x lamination<br>• 2x μvia<br>• 3-6x drilling step | +++ | - | +++ |
| • 2x cores with inlay + 1x core<br>• 4x lamination<br>• 4x μvia<br>• 3-5x drilling step | +++ | - | ++ |
| • 2x cores with inlay + 1x core<br>• 5x lamination<br>• 4x μvia<br>• 3-6x drilling step | +++ | ++ | ++ |
| • 2x cores with inlay + 2x cores<br>• 3-4x lamination<br>• 2x μvia<br>• 3-6x drilling step | +++ | - | +++ |
| • 2x cores with inlay<br>• 5x lamination<br>• 4x μvia<br>• 3-5x drilling step | ++ | ++ | +++ |

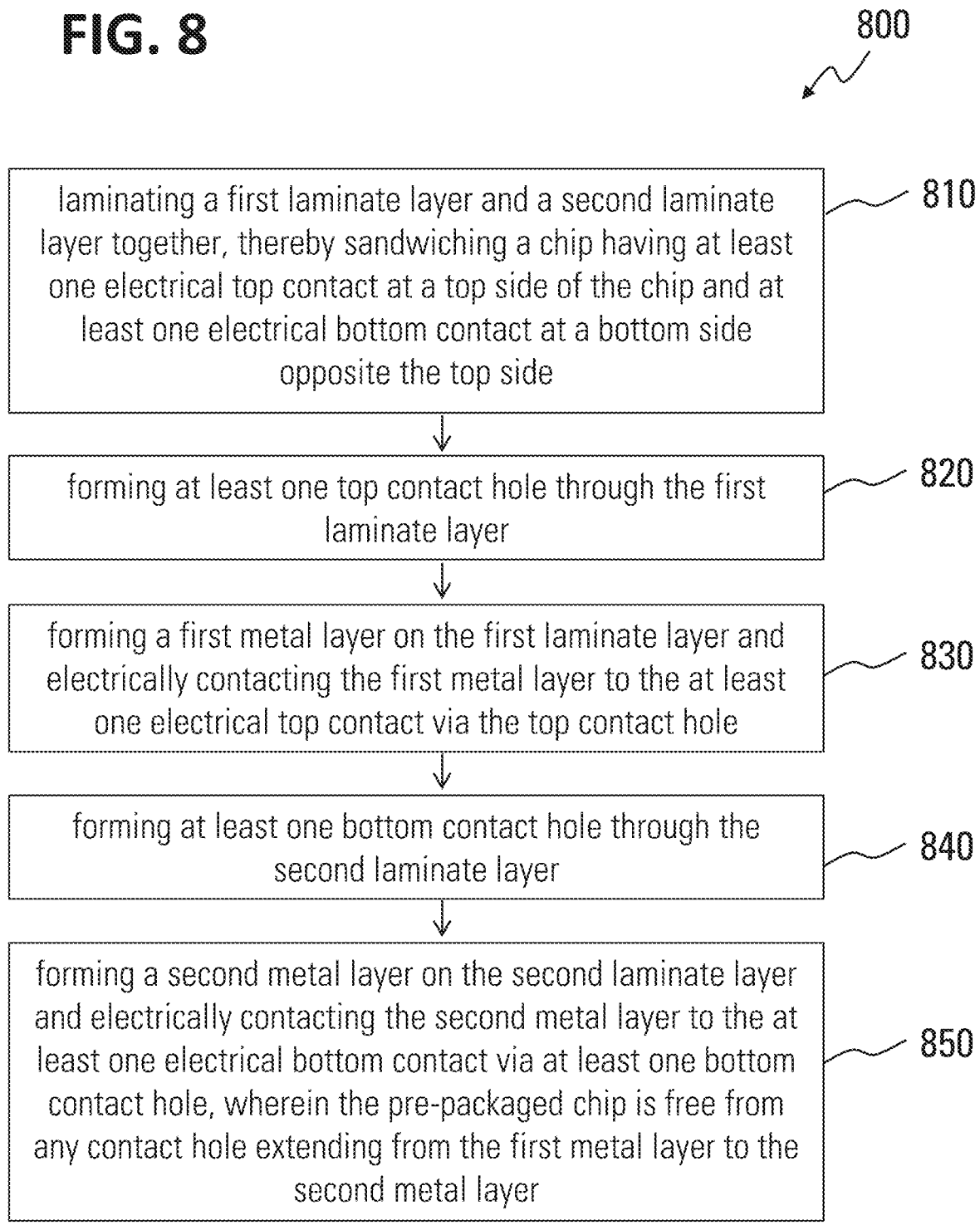

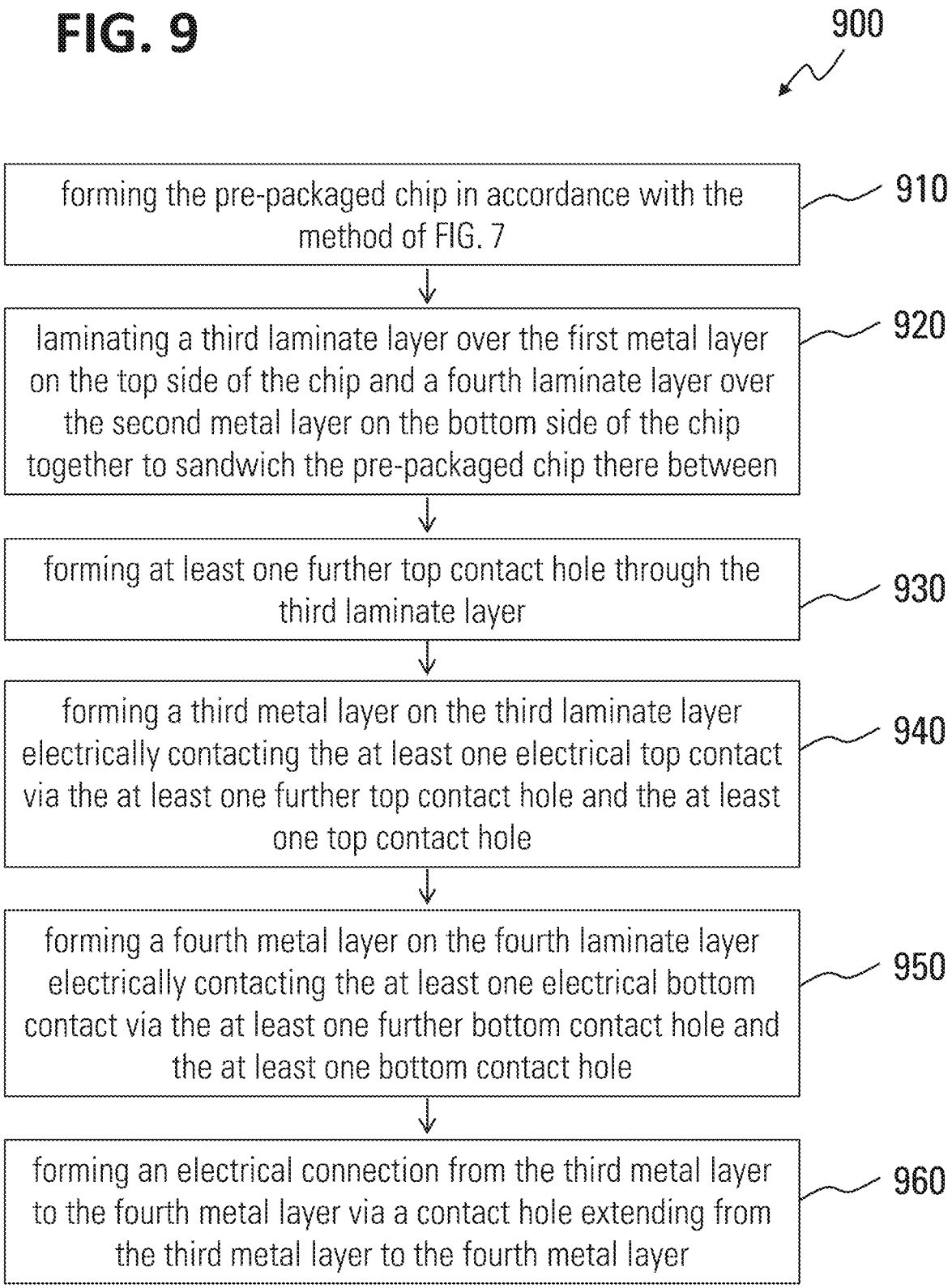

1010 — forming a pre-packaged chip, including laminating a first laminate layer and a second laminate layer together, thereby sandwiching a chip having at least one electrical top contact at a top side of the chip and at least one electrical bottom contact at a bottom side opposite the top side, forming at least one top contact hole through the first laminate layer, forming a first metal layer on the first laminate layer and electrically contacting the first metal layer to the at least one electrical top contact via the top contact hole, forming at least one bottom contact hole through the second laminate layer, forming a second metal layer on the second laminate layer, and electrically contacting the second metal layer to the at least one electrical bottom contact via at least one bottom contact hole 1020 — laminating a third laminate layer over the first metal layer on the top side of the chip and a fourth laminate layer over the second metal layer on the bottom side of the chip together to sandwich the pre-packaged chip there between 1030 — forming at least one further top contact hole through the third laminate layer 1040 — forming a third metal layer on the third laminate layer electrically contacting the at least one electrical top contact via the at least one further top contact hole and the at least one top contact hole 1050 — forming a fourth metal layer on the fourth laminate layer electrically contacting the at least one electrical bottom contact via the at least one further bottom contact hole and the at least one bottom contact hole 1060 — forming an electrical connection from the third metal layer to the fourth metal layer via a contact hole extending through the pre-packaged chip from the third metal layer to the fourth metal layer

FIG. 11 1100

1110 — forming a pre-packaged chip, including laminating a first laminate layer and a second laminate layer together, thereby sandwiching a chip having at least one electrical top contact at a top side of the chip and at least one electrical bottom contact at a bottom side opposite the top side, forming at least one top contact hole through the first laminate layer, forming a first metal layer on the first laminate layer and electrically contacting the first metal layer to the at least one electrical top contact via the top contact hole, forming at least one bottom contact hole through the second laminate layer, forming a second metal layer on the second laminate layer, and electrically contacting the second metal layer to the at least one electrical bottom contact via at least one bottom contact hole 1120 — laminating a third laminate layer over the first metal layer on the top side of the chip and a fourth laminate layer over the second metal layer on the bottom side of the chip together to sandwich the pre-packaged chip there between 1130 — forming at least one further top contact hole through the third laminate layer 1140 — forming a third metal layer on the third laminate layer electrically contacting the at least one electrical top contact via the at least one further top contact hole and the at least one top contact hole

PRE-PACKAGED CHIP, METHOD OF MANUFACTURING A PRE-PACKAGED CHIP, SEMICONDUCTOR PACKAGE AND METHOD OF MANUFACTURING A SEMICONDUCTOR PACKAGE

TECHNICAL FIELD

Various embodiments relate generally to a pre-packaged chip, a method of manufacturing a pre-packaged chip, a semiconductor package, and to a method of manufacturing a semiconductor package.

BACKGROUND

An increase of an efficiency and of power density are commonly amongst the most important objectives in power electronics. Each new generation of power semiconductors delivers better parameters that can be translated into efficiency and power density improvements. However, factors like semiconductor packages, printed circuit board (PCB) layout and manufacturing, and an arrangement of components in the system may compromise potential improvements that could be made possible by new semiconductor technologies.

Such factors may for example relate to a size and/or a thermal behavior, as well as parasitic elements (e.g., resistances, inductances, and capacitances) that are to be optimized.

SUMMARY

A pre-packaged chip is provided. The pre-packaged chip may include a chip having at least one electrical top contact at a top side of the chip and at least one electrical bottom contact at a bottom side opposite the top side, a first laminate layer on the top side, a second laminate layer on the bottom side, wherein the first laminate layer and the second laminate layer are laminated together to sandwich the chip therebetween, a first metal layer on the first laminate layer and electrically contacted to the at least one electrical top contact via at least one top contact hole through the first laminate layer, and a second metal layer on the second laminate layer and electrically contacted to the at least one electrical bottom contact via at least one bottom contact hole through the second laminate layer, wherein the pre-packaged chip is free from any contact hole extending from the first metal layer to the second metal layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

Figure 3A:
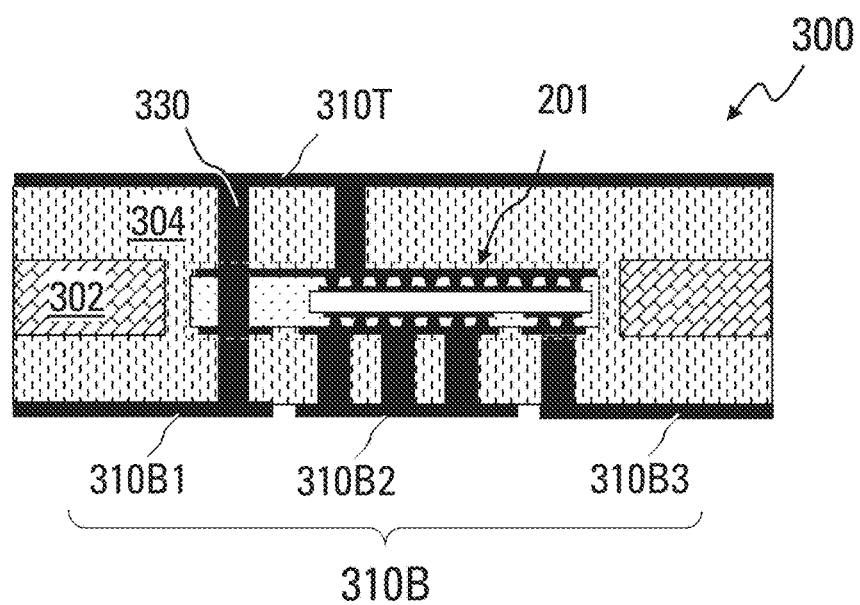
Figure 3B:
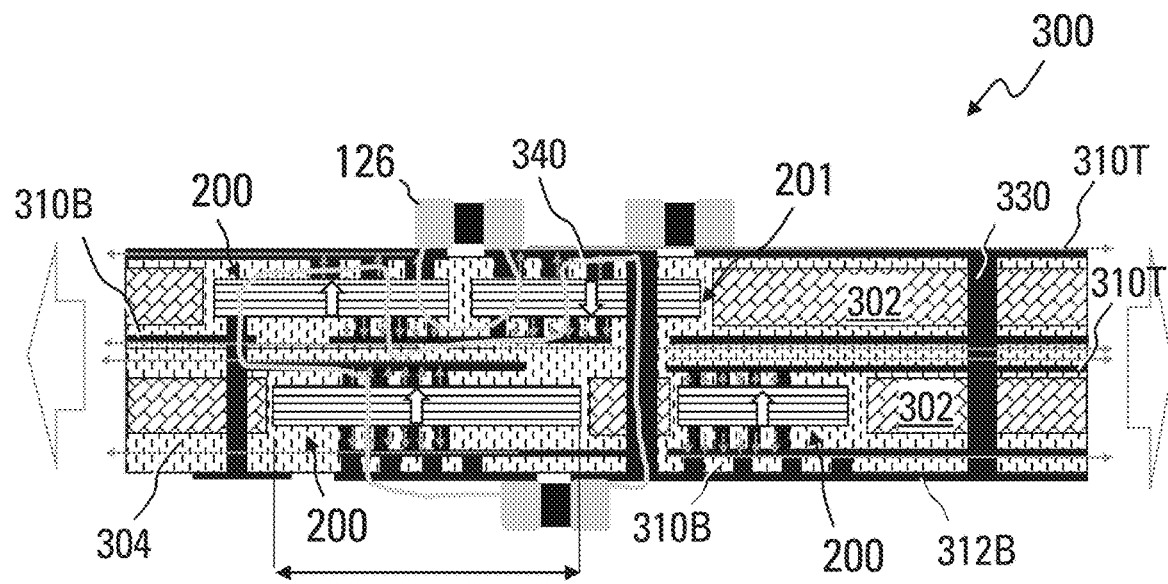
Figure 3C:
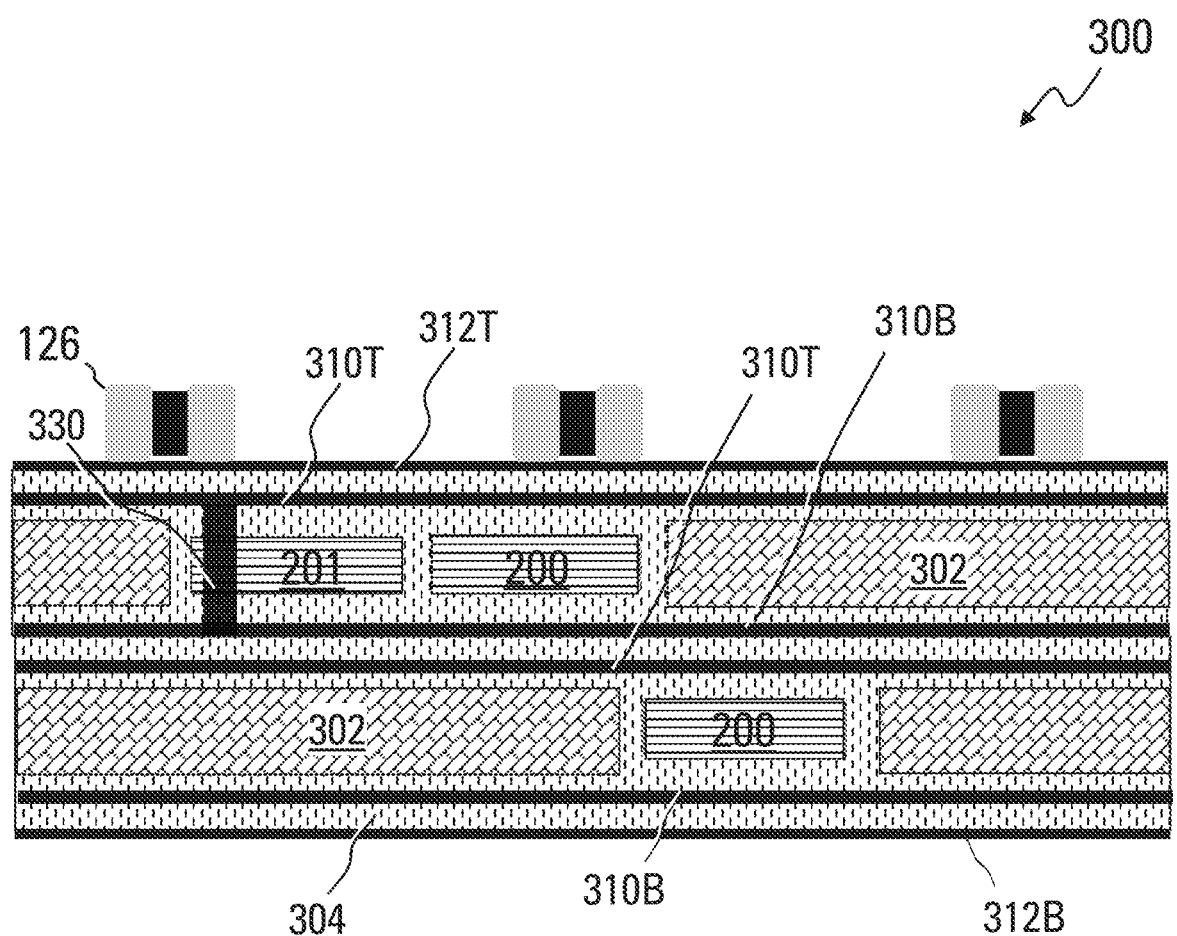
Figure 4A:
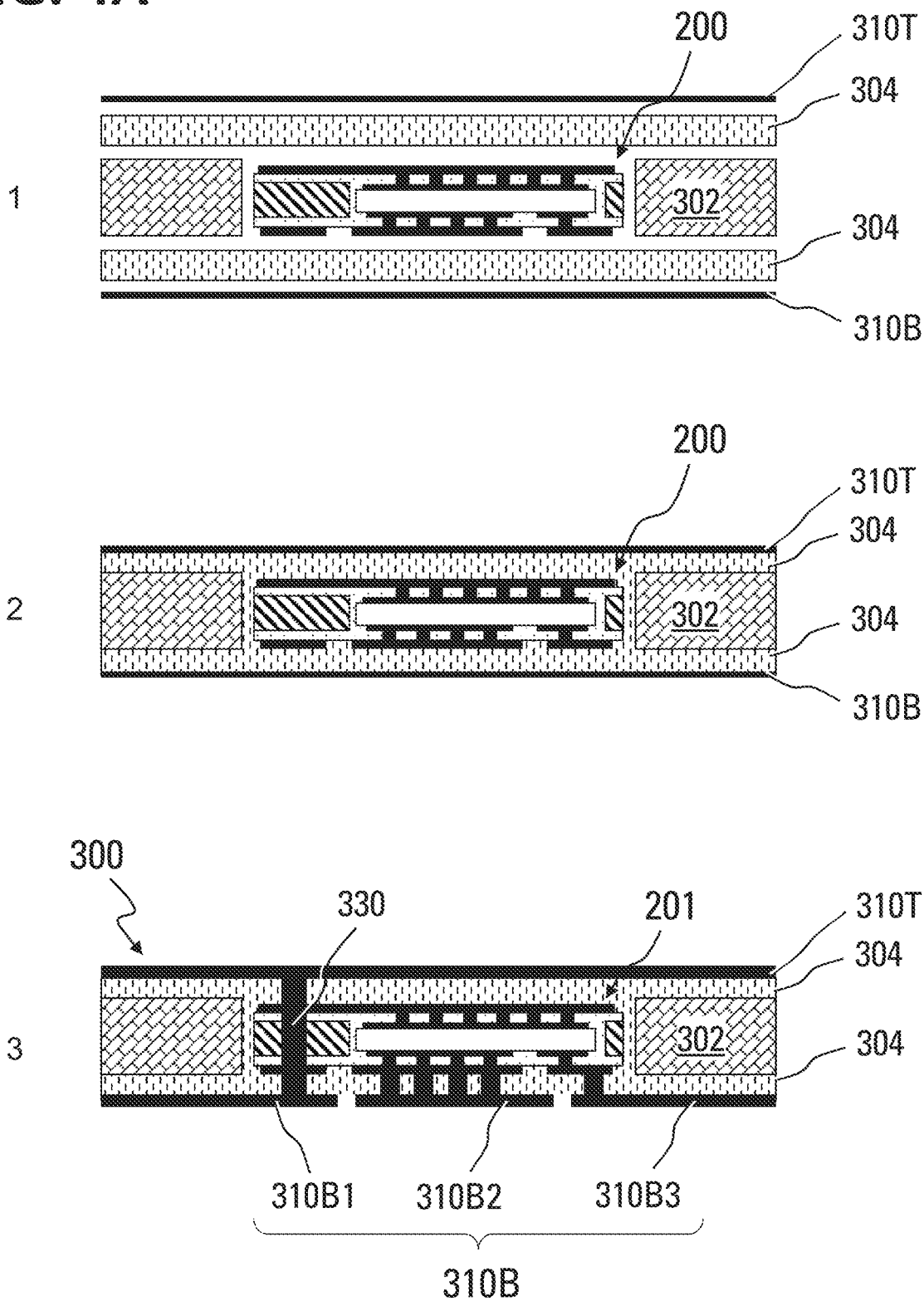
Figure 4B:
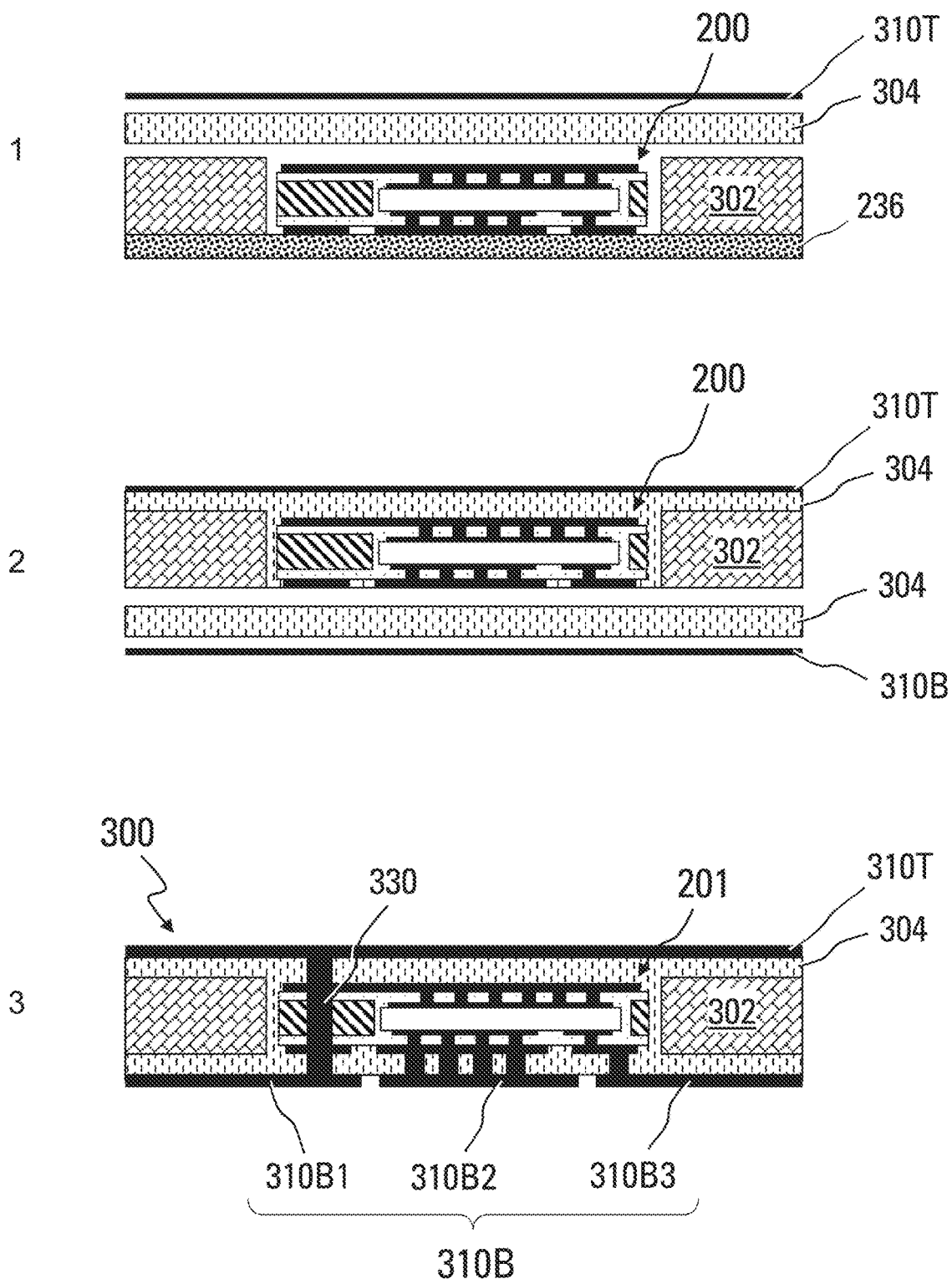
Figure 5A:
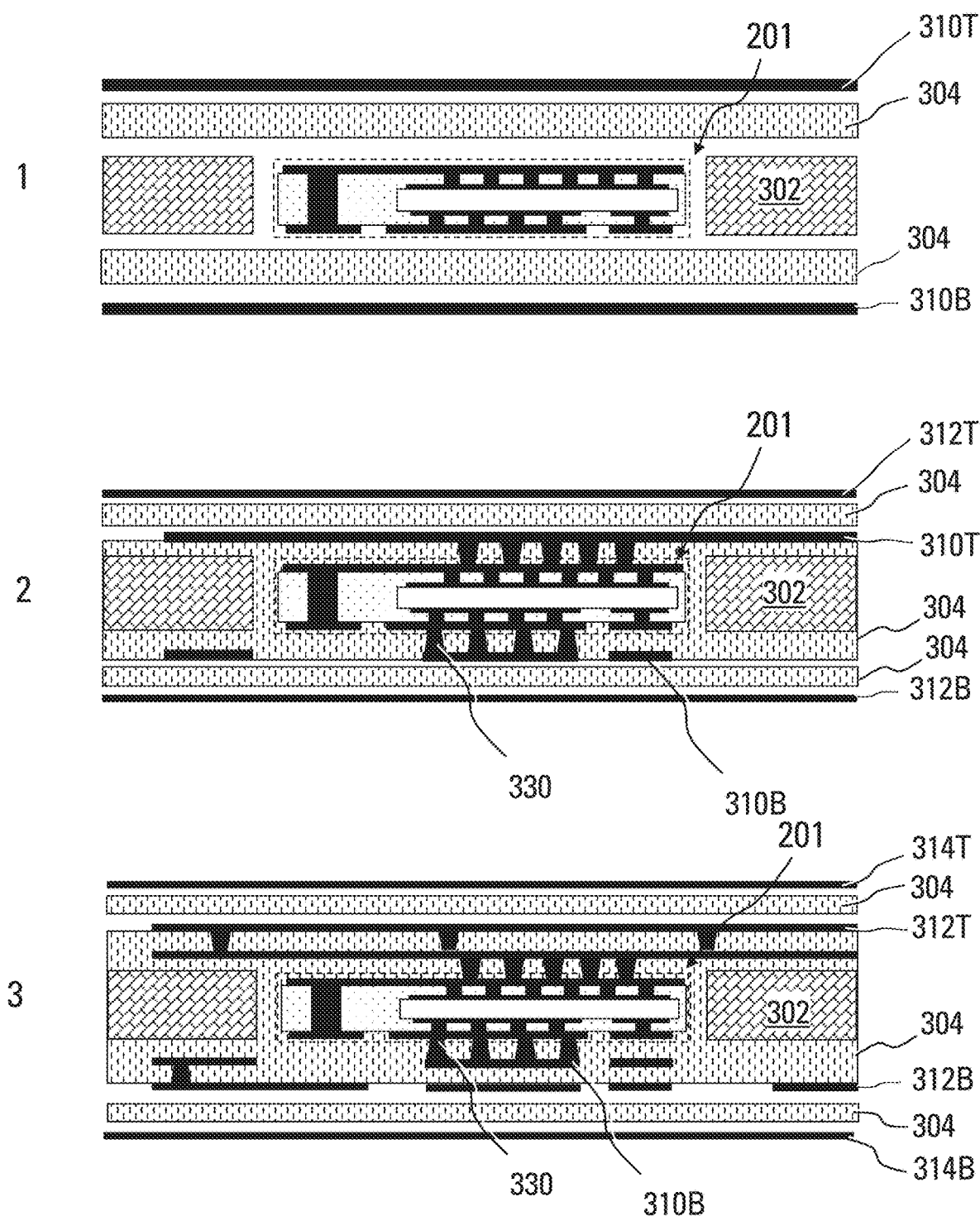
Figure 5B:
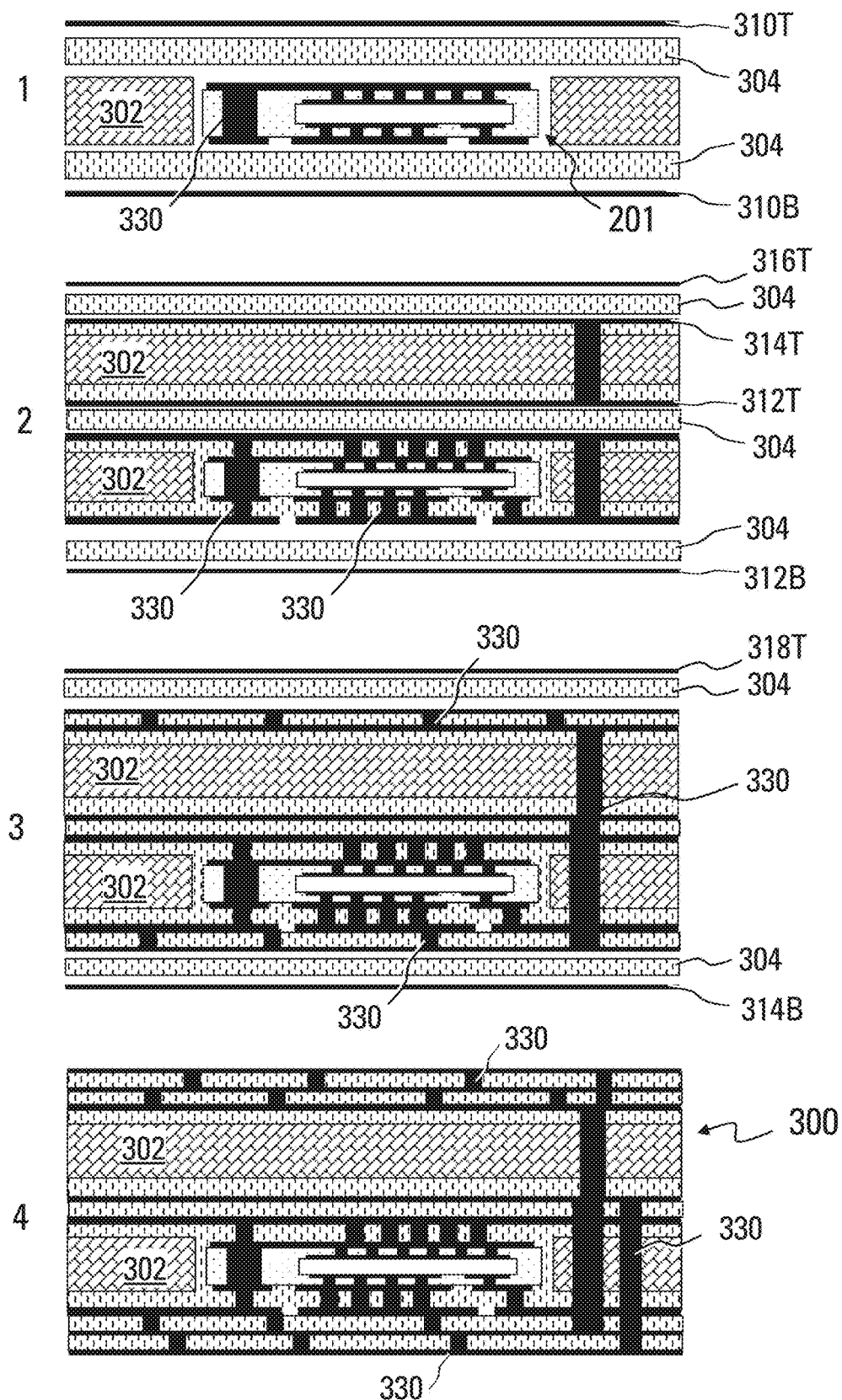
Figure 5C:
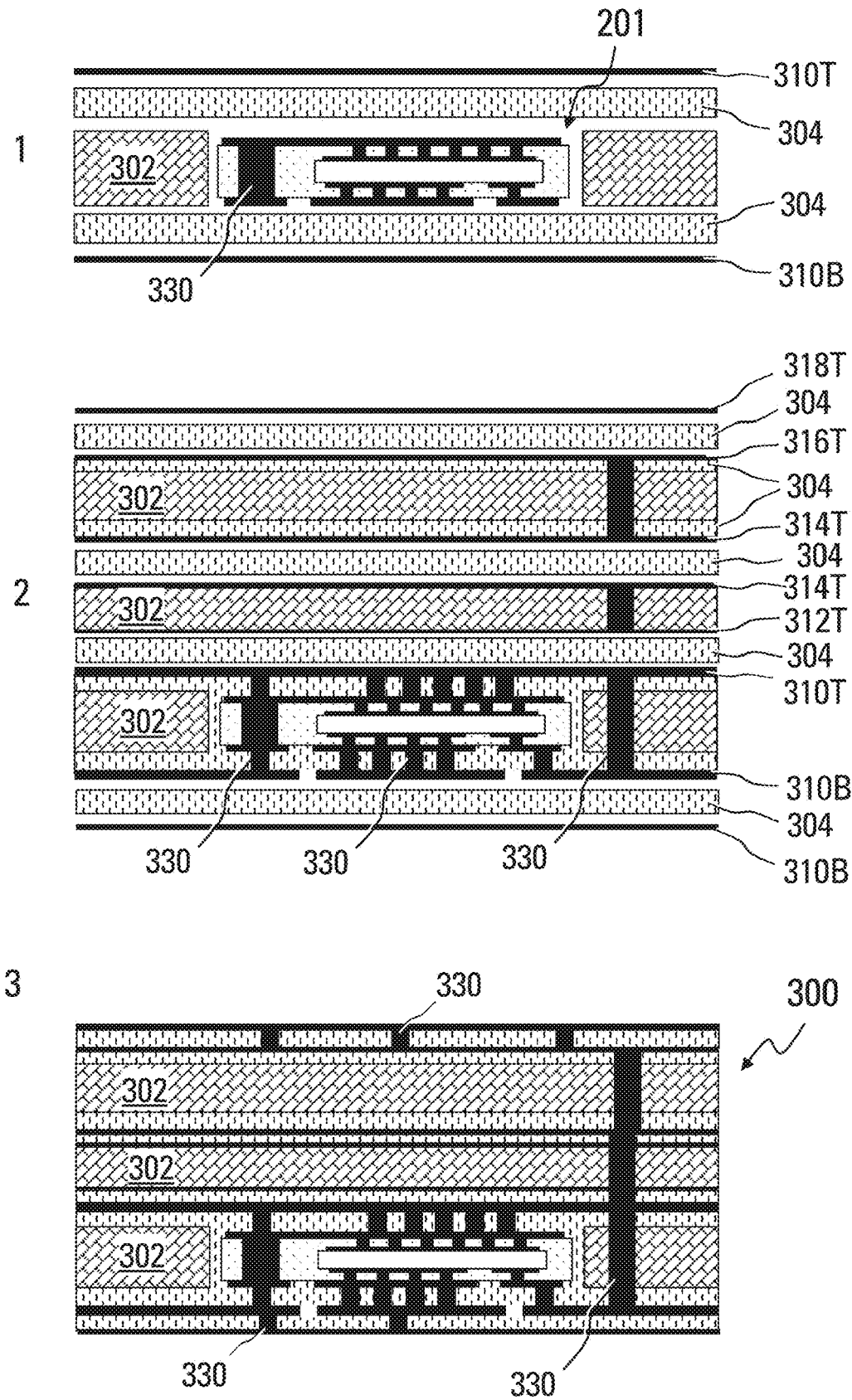
Figure 5D:
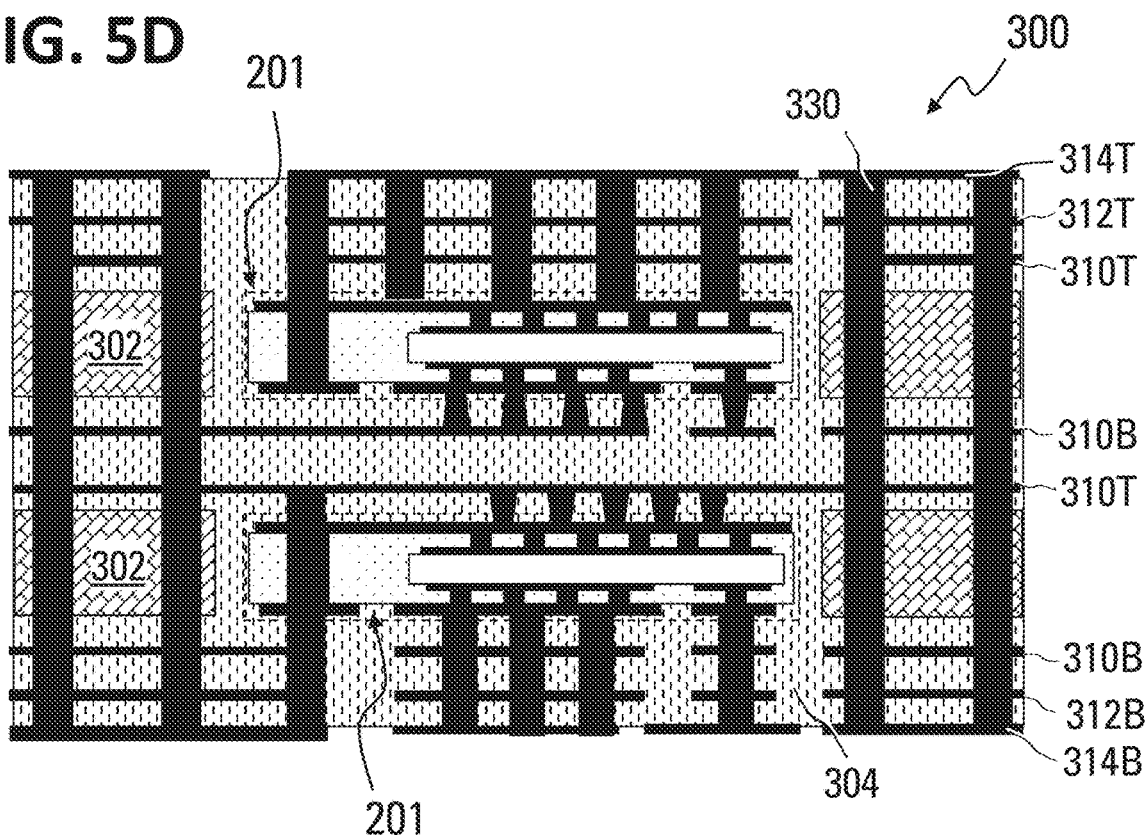
Figure 5E:
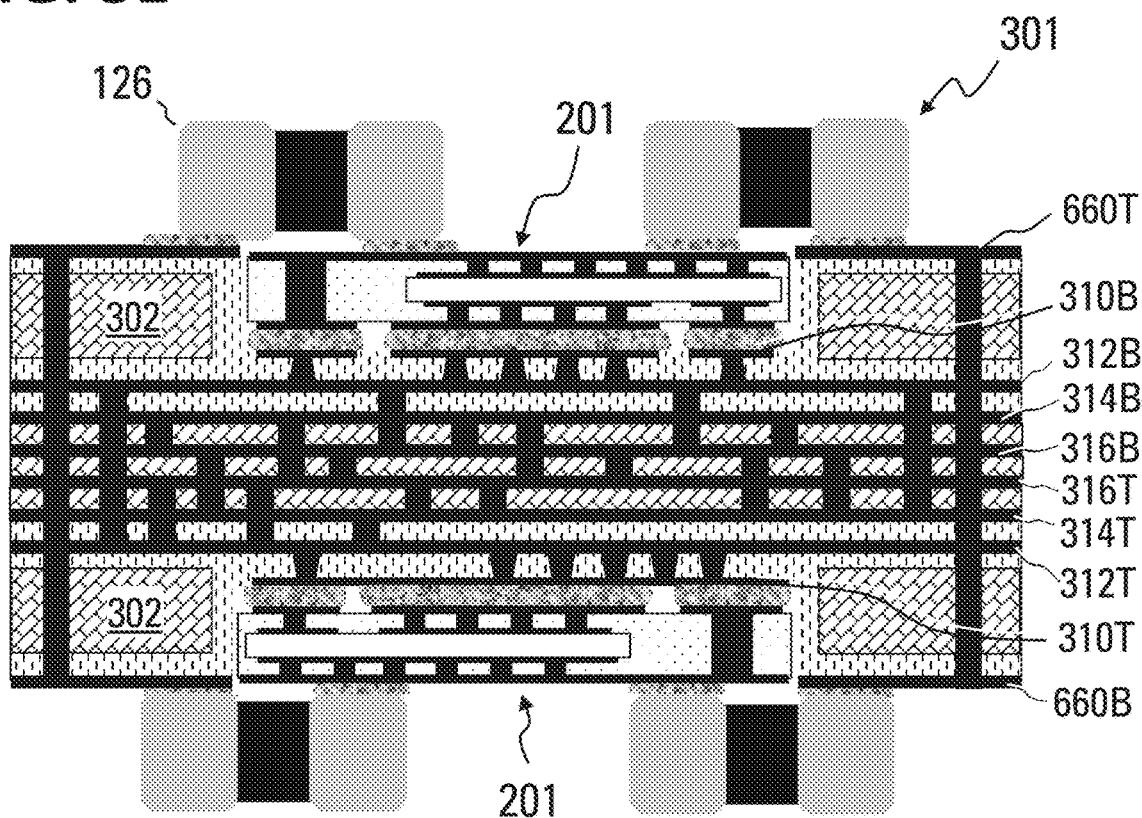
Figure 11:
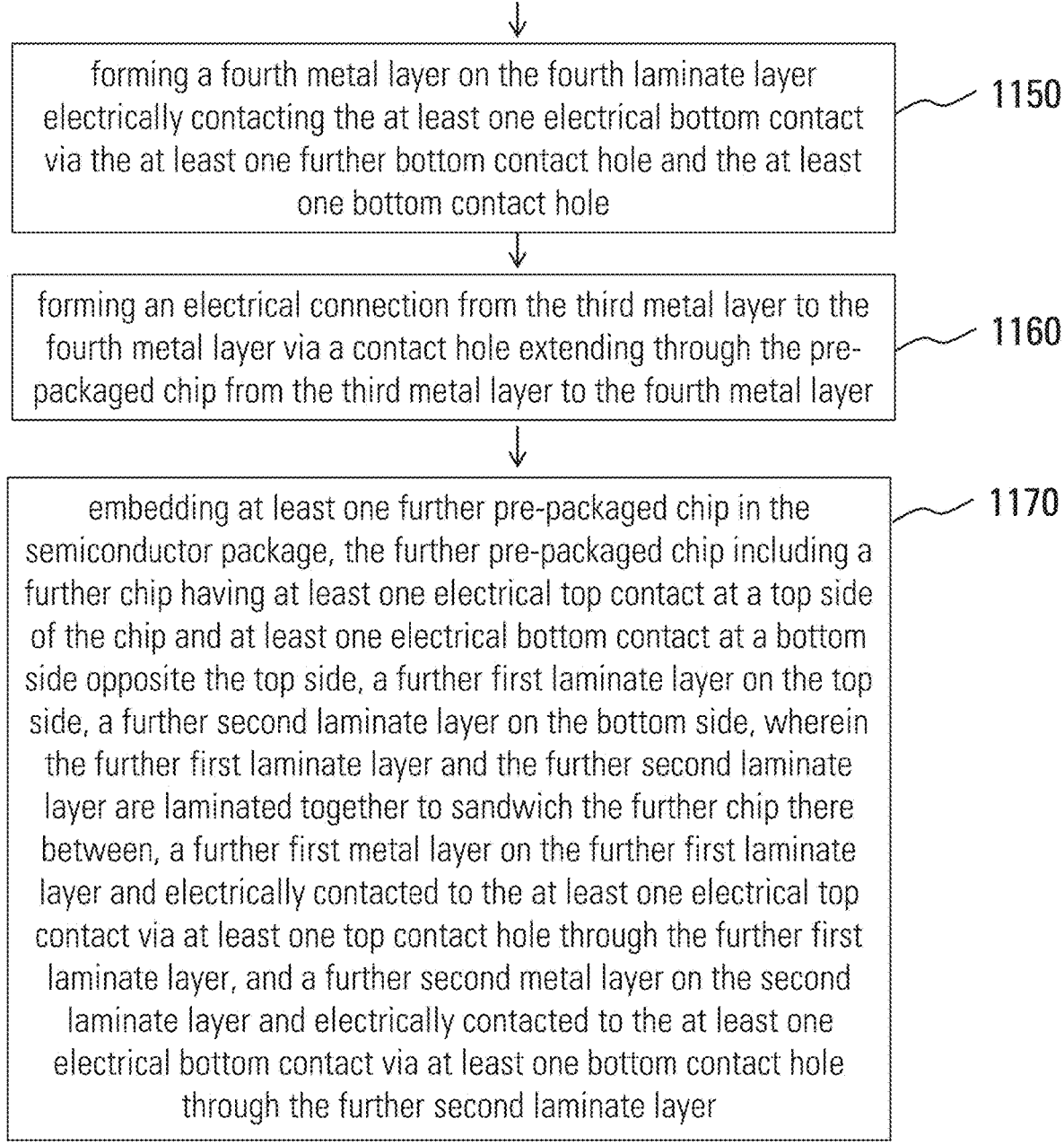

each of FIG. 3A to FIG. 3C shows a schematic cross-sectional view of a semiconductor package in accordance with various embodiments;

each of FIGS. 4A and 4B visualizes, as an illustration of several sequential processes, a method of manufacturing a semiconductor package in accordance with various embodiments;

each of FIG. 5A to 5C visualizes, as an illustration of several sequential processes, a method of manufacturing a semiconductor package in accordance with various embodiments;

each of FIGS. 5D and 5E shows a schematic cross-sectional view of a semiconductor package in accordance with various embodiments;

each of FIG. 6A to 6D shows a top view and corresponding schematic cross-sectional views of a pre-packaged chip in accordance with various embodiments;

FIG. 7 shows a table illustrating advantages of different semiconductor packages in accordance with various embodiments;

FIG. 8 is a flow diagram of a method of manufacturing a pre-packaged chip in accordance with various embodiments;

FIG. 9 is a flow diagram of a method of manufacturing a semiconductor package in accordance with various embodiments;

FIG. 10 is a flow diagram of a method of manufacturing a semiconductor package in accordance with various embodiments; and FIG. 11 is a flow diagram of a method of manufacturing a semiconductor package in accordance with various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

"Chip" and "die" are used as synonyms, unless noted otherwise.

Figure 1A:
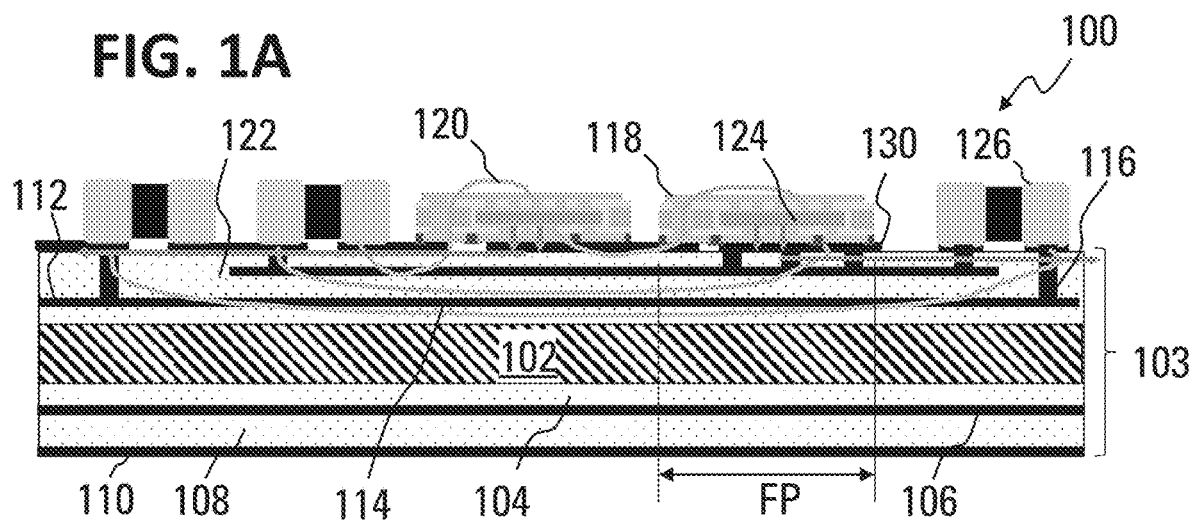
FIG. 1A shows a schematic cross-sectional view of a semiconductor arrangement according to a prior art.

FIG. 1A shows a schematic cross-sectional view of a semiconductor arrangement 100 according to a prior art.

The semiconductor arrangement 100 includes chip packages 118 and passive components 126 surface-mounted on a PCB 103 that includes structured metallization layers 106, 110, 112, 130, a carrier 102, and insulation material 104, 108, 122.

The current paths 120 in FIG. 1A between the widely distributed surface mounted components 118, 126 are rather long, which may cause large parasitic inductances that may cause a large voltage overshoot. Furthermore, large PCB AC/DC resistances may occur, with corresponding increased ohmic losses in high power boards.

A lack of inherent top side cooling (the thermal connection to the PCB may be through the respective bottom sides of the components 118, 126 only), a heat distribution (see arrows in FIG. 1A) on the PCB 103 mainly within the solder layer, and a thermal bottleneck formed by a small footprint FP of the chip packages 118 may cause a rather poor thermal performance.

Figure 1B:
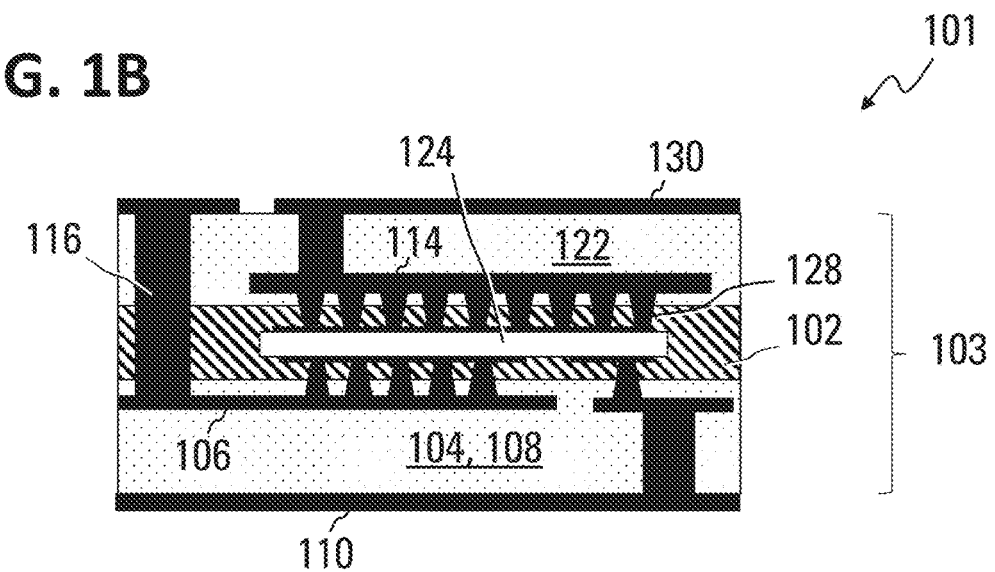
FIG. 1B shows a schematic cross-sectional view of a semiconductor package according to a prior art.

One way to reduce the long current paths in a semiconductor package 101 and to improve the heat distribution is (see FIG. 1B) to move electronic parts (in other words, the chip 124) from top and/or bottom sides of the PCB 103 to inside the PCB 103 laminated layers 104, 108, 122. Shorter electrical paths and interconnections may reduce parasitic components, and vertical stacking of electrical parts may be a way to achieve it.

However, a mass production embedding of bare dies 124 in the PCB 103 may present significant challenges with respect to system reliability, ease of manufacturing processes and a consistent yield: The handling of brittle bare silicon in a rough standard PCB manufacturing environment may be difficult and lead to yield losses. A special equipment and/or a highly sophisticated process control may avoid the high yield losses, but may mean that only few suppliers are available and related manufacturing costs may be relatively high.

Furthermore, the direct embedding of the semiconductor bare dies 124 into the PCB 103 may require a sophisticated knowledge of the subsystem interfaces, e.g. materials, surface finishes and structure, etc., in order to ensure a good system reliability.

In addition, a choice for PCB 103 materials may be limited, since the typically used PCB 103 materials (e.g., laminating materials) may not be comparable to those used in molded semiconductor packages in terms of purity and protection.

Alternatively, using the known (less pure) PCB 103 materials may impose special requirements on the semiconductor chip 124 to be suited for use in a high-level contaminants environment.

The chip 124 may have a small pad size (e.g., about 160 μm in one dimension), which may present an extra challenge for contacting the brittle and thin chip 124.

Since soldering may not be possible in this situation, it may be necessary to use ultraprecise laser drilled microvias 128 for contacting the chip 124. For a good thermal performance, a microvia 128 array interconnection with a high density may need to be provided between the bare die 124 and PCB metallization layer 106, 114, which may be expensive.

Using dies 124 with different thicknesses within the same semiconductor package 101 may be difficult or impossible.

A testing of the dies 124 may typically only be performed at a wafer level (with limited test coverage), or after the embedding in the semiconductor package 101. In particular in a case where more than one chip 124 is included in the semiconductor package 101, a risk of yield loss on PCB level may be increased.

The above outlined necessary know-how may not normally be a core competency of power supplies manufacturers, and may require them to go through lengthy and expensive learning cycles to acquire it.

As a consequence, although highly desired by the market, embedding bare dies 124 directly in the PCB 103 has not been successful beyond a prototype stage.

In various embodiments, a pre-packaged chip for embedding into a PCB is provided.

The term "pre-packaged chip" is to be understood to describe a structure, e.g., a pre-package, that includes a chip (as opposed to a chip that has the characteristic of being pre-packaged).

The pre-packaged chip may be symmetric or asymmetric, for example with respect to a central plane parallel to main surfaces of the pre-packaged chip.

The pre-packaged chip may in various embodiments be formed as a PCB-based package with two or more laminating layers that may allow an easy handling by a conventional PCB production line. The pre-packaged chip may include large area copper pads on top and/or bottom of the die(s) for mechanically or laser drilled blind vias and/or large area fan out copper pads for mechanically drilled though holes (or mechanically or laser drilled blinds) that may not require a high aligning accuracy.

The pre-packaged chip may in various embodiments be considered to be semi-finished, because the pre-packaged chip may not be useable as a standalone chip package or as a surface mount device, but may rather need to be embedded in a PCB board for full functionality.

The pre-packaged chip may be provided without a through connection from top to bottom. In various embodiments, the pre-packaged chip may remain without the through connection even in the final semiconductor package. In various other embodiments, a through connection may be formed during the embedding of the pre-packaged chip into the semiconductor package.

In various embodiments, as opposed to bare die, it is much easier and less costly to deliver fully tested pre-packaged chips. This may reduce a risk of fails at system level, and may make it much easier to identify a root cause in case of failures, leading to a much cleaner starting situation when clarifying responsibilities and liabilities in such cases.

In various embodiments, the pre-packaged chip, which may also be referred to as an inlay, may have its surfaces surface treated for increased adhesion to a laminating material in which the pre-packaged chip may be embedded. The surface treatment may for example be applied to copper and to the laminating material.

For the laminate material of the pre-packaged chip, a high quality material may be used, for example a clean, low chlorine, halogen and other impurities laminate material that may protect the die and allow to use standard low cost PCB materials for the semiconductor package, e.g. for the embedding material of the semiconductor package.

In various embodiments, a plurality of chips may be included in the pre-packaged chip.

In various embodiments, a plurality of pre-packaged chips, each of which including at least one chip, may be included in a semiconductor package.

The pre-packaged chip may include at least one carrier or core. The chip(s) may be arranged in one or more openings of the carrier, wherein the openings may be through-holes or blind holes. A plurality of chips may include each of the chips in its own opening, or more than one chip per opening.

The pre-packaged chips may be electrically connected to metallization layers of the semiconductor package or to each other through vias, which may be formed by mechanical drilling or laser drilling.

In various embodiments, the semiconductor package may form an. asymmetric (or symmetric) stack of core layers with embedded inlays.

A use of a conventional PCB manufacturing process with standard low cost PCB material may be used for the embedding of the pre-packaged chip into the semiconductor package. In other words, a high density interconnect (HDI) process that is used in chip embedding (CE) may not be needed.

In various embodiments, a two level interconnection- and assembly processes is provided. As a first level process, a high accuracy, high density, high cost processing may be used for forming a pre-packaged chip that includes precise and numerous microvias for electrically and thermally connecting the semiconductor (e.g., silicon) to large connection pads provided on an outside of the pre-packaged chip, and a low density, low accuracy and low cost processing to connect the pre-packaged chip to the final PCB, e.g. by embedding the pre-packaged chip inside the PCB.

The two-level interconnection- and assembly process may allow to overcome limitations found for direct bare die PCB embedding regarding cost, manufacturability, reliability, material set and accountability may be overcome, while key advantages of direct bare die PCB embedding may be kept.

A stacked arrangement of the pre-packaged chips inside the PCB may in various embodiments be chosen to allow vertical current flows and/or control the heat flow. Furthermore, additional electronic components may be mounted on top of the PCB, further improving the vertical, or rather three-dimensional, current flow.

The pre-packaged chips, e.g. MOSFETs, may be placed asymmetrically close to a surface (not in the center of the board like in normal chip embedding) just underneath one or more of the surface mounted electronic components to shorten the connection length and minimize parasitic elements.

Figure 2A:
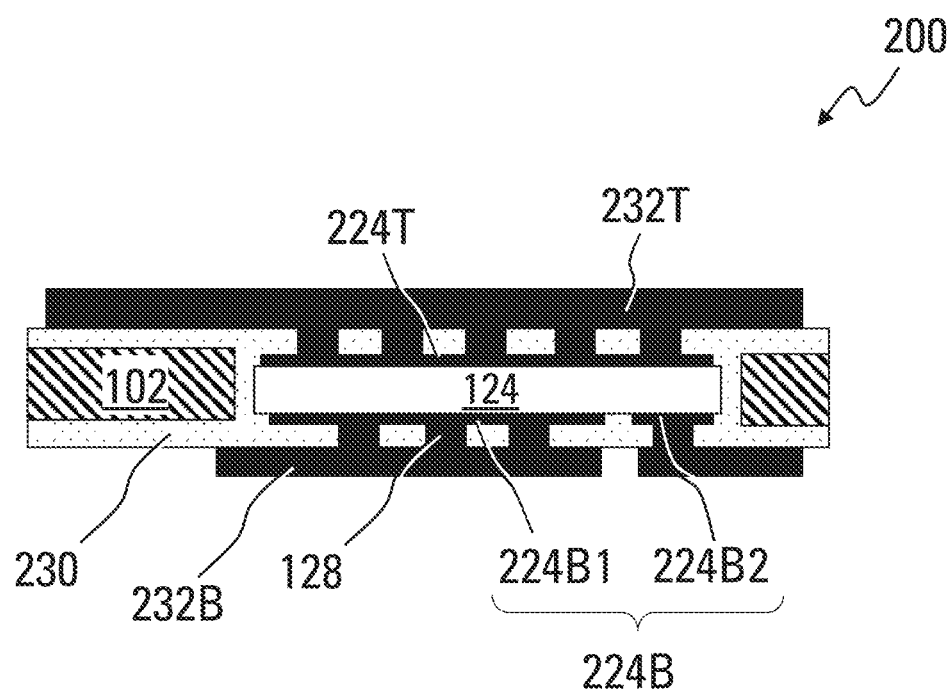
FIG. 2A shows a schematic cross-sectional view of a pre-packaged chip in accordance with various embodiments.
Figure 2B:
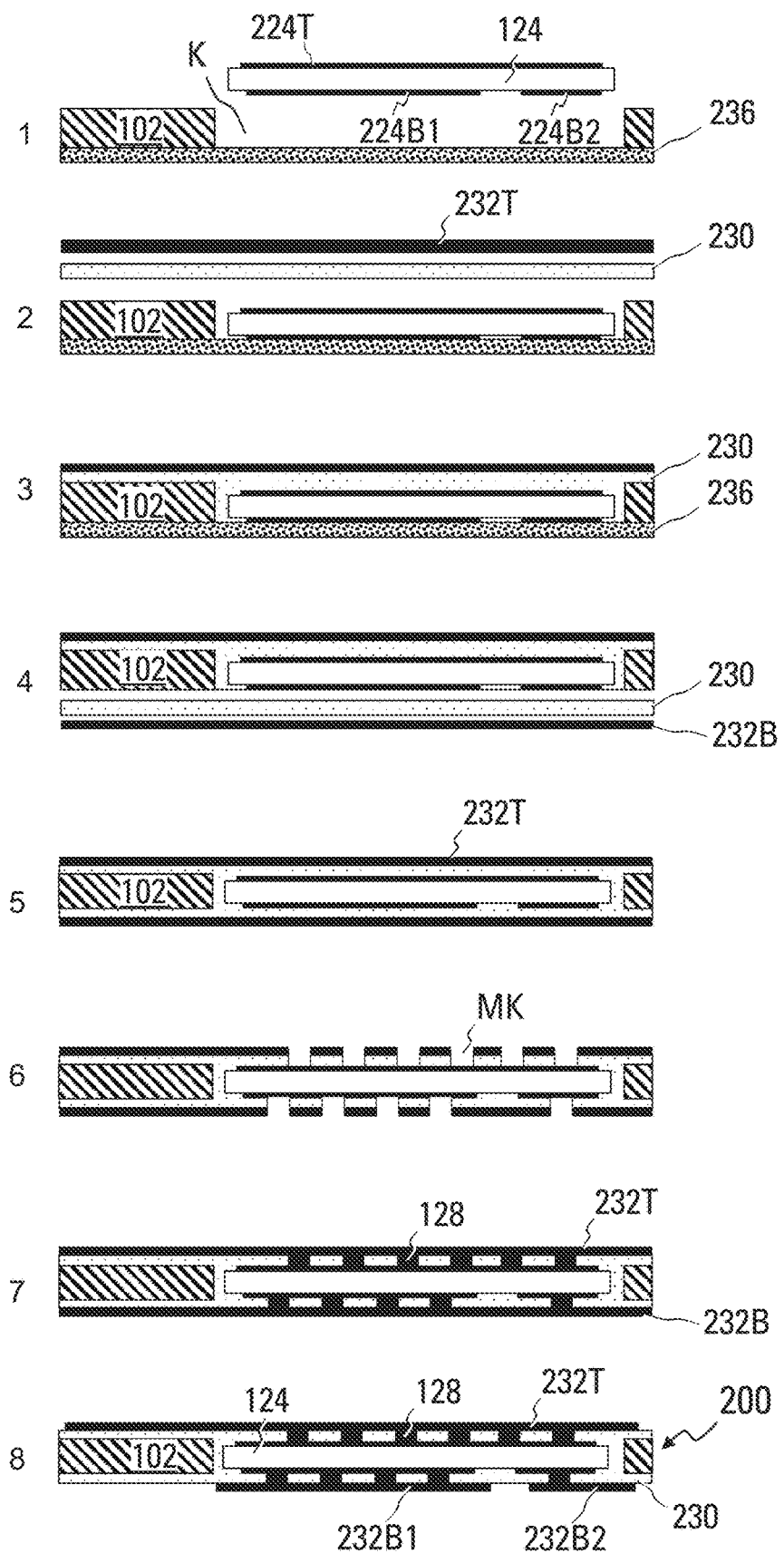
FIG. 2B visualizes, as an illustration of several sequential processes, a method of manufacturing a pre-packaged chip in accordance with various embodiments, for example the pre-packaged chip of FIG. 2A.

FIG. 2A shows a schematic cross-sectional view of a pre-packaged chip 200 in accordance with various embodiments, FIG. 2B visualizes, as an illustration of several sequential processes, a method of manufacturing a pre-packaged chip 200 in accordance with various embodiments, for example the pre-packaged chip 200 of FIG. 2A, and each of FIG. 6A to 6D shows a top view and corresponding schematic cross-sectional views of a pre-packaged chip 200 in accordance with various embodiments. The pre-packaged chip 200 is also referred to as pre-package 200 and/or as inlay 200.

The pre-packaged chip 200 may include a chip 124, for example a semiconductor chip, e.g. a chip 124 including at least one circuit element. The chip 124 may for example form a (power) transistor, for example a MOSFET, a (power) diode, or the like. The chip 124 may have at least one electrical top contact 224T at a top side of the chip 124 and at least one electrical bottom contact 224B at a bottom side opposite the top side. In various embodiments, as shown in FIGS. 2A and 2B, the chip 124 may have two (or more) bottom contacts 224B1, 224B2, . . . and/or more than one top contact 224T.

While throughout the description, relative positions like "top", "bottom", etc., may usually be used to indicate a relative position as shown in the figures, the respective terms "top contact 224T" and "bottom contact 224B" may always refer to the same functional type of contact for a given type of chip 124. Thus, for example, a drain contact identified as the top contact 224T may still be referred to as the top contact 224T, even if the chip 124 is placed in a top-down configuration in the pre-packaged chip 200.

The pre-packaged chip 200 may further include a first laminate layer 230 on the top side, and a second laminate layer 230 on the bottom side, wherein the first laminate layer 230 and the second laminate layer 230 are laminated together to sandwich the chip 124 therebetween. After the lamination process, which extends from view 1 to view 5 in FIG. 2B, the first laminate layer 230 and the second laminate layer 230 may form an integral structure that includes the chip 124.

The pre-packaged chip 200 may further include a first metal layer 232T on the first laminate layer 230 and electrically contacted to the at least one electrical top contact via at least one top contact hole 128 through the first laminate layer 230, and a second metal layer 232B on the second laminate layer 230 and electrically contacted to the at least one electrical bottom contact 224B via at least one bottom contact hole 128 through the second laminate layer 230.

The first metal layer 232T and/or the second metal layer 232B may include or consist of copper or a copper alloy, or of any other metal typically used for metallization layers of printed circuit boards. The first metal layer 232T and/or the second metal layer 232B may for example include a layer stack of a plurality of metal layers.

The first metal layer 232T and/or the second metal layer 232B may in various embodiments be shaped as large area fan out (e.g. copper) pads for mechanically drilled through holes (or mechanically or laser drilled blind holes) that may allow an easy handling in a conventional PCB line when including the pre-packaged chip 200 in a semiconductor package 300, and thus may allow an electrical contacting without having to provide a high aligning accuracy In various embodiments, the pre-packaged chip 200 may be free from any contact hole extending from the first metal layer 232T to the second metal layer 232B. For this reason, the pre-packaged chip 200 may in various embodiments be considered to be semi-finished, because the pre-packaged chip 200 may not be useable as a standalone chip package or as a surface mount device, but may need further embedding into a semiconductor package, for example as shown below, for full functionality.

The pre-packaged chip 200 may be provided without a through connection from top to bottom. In various embodiments, the pre-packaged chip 200 may remain without the through connection even in the final semiconductor package. In various other embodiments, a through connection 330 may be formed during the embedding of the pre-packaged chip 200 into a semiconductor package 300. A pre-defined location for such a through connection 330, for example a plated through-hole (PTH) 330, is indicated in FIG. 6A to FIG. 6D by an arrow.

The first laminate layer 230 may in various embodiments have the same thickness as the second laminate layer 230. In various embodiments, the first laminate layer 230 may include or consist of the same material as the second laminate layer 230.

A material of the laminate layer 230 may include or consist of a high quality laminate material 230, for example a clean laminate material 230 that may have a low concentration of chlorine, halogens and other impurities, for example a polymer. Thereby, the laminate material 230 may protect the die 124, for example from a laminate material 304 that may be used for an embedding of the pre-packaged chip 200 into the semiconductor package 300 or 301.

The first metal layer 232T may in various embodiments have the same thickness as the second metal layer 232B. In various embodiments, the first metal layer 232T may include or consist of the same material as the second metal layer 232B.

Using the same materials and layer thicknesses for the first and the second laminate layer 230 and for the first and the second metal layer 232T, 232B may avoid or at least minimize warping of the pre-packaged chip 200. However, for various purposes, the first metal layer 232T and the second metal layer 232B may have different thicknesses and/or different materials, and/or the first laminate layer 304 and the second laminate layer 304 may have different thicknesses and/or different materials The pre-packaged chip 200 may include a carrier 102, also referred to as first carrier 102 for easy distinction from a second carrier 302 of the semiconductor package 300 or as core. The first carrier 102 may include a first opening K (see FIG. 2B), wherein the chip 124 is arranged in the first opening K.

The opening K may be larger in plane dimensions than the chip 124, leading to a clearance between the chip 124 and cavity K side walls. The first carrier 102 may be thicker than the chip 124, leading to a void above the chip 124.

The lamination of the first laminate layer 304 may close the void on top of the chip 124 and the clearance between the opening K side walls and the chip 124 side walls during the lamination process.

In various embodiments, the pre-packaged chip 200 may include at least one further chip 124 sandwiched between the first laminate layer 230 and the second laminate layer 230.

The chip 124 and the further chip 124 may in various embodiments be arranged with their respective top contacts 224 facing the same side of the pre-packaged chip 200. Such an arrangement is for example shown in FIG. 6B, FIG. 6C, and chips a and d of FIG. 6D.

The chip 124 and the further chip 124 may in various embodiments be arranged with their respective top contacts 224 facing opposite sides of the pre-packaged chip 200. Such an arrangement is for example shown in for chips a and b of FIG. 6D.

In case of a first carrier 102 being part of the pre-packaged chip 200, each of the chips 124 may be placed in its own opening K, or several chip 124 may be placed together in an opening K.

As further shown in FIG. 2B, the chip 124 may be placed on a temporary carrier 236 for the laminating process laminating the first laminate layer 230 and the first metal layer 232T onto the chip 124 (between views 2 and 3).

Thereafter, the temporary carrier 236 may be removed, and the second laminate layer 230 may be laminated onto the chip 124 together with the second metal layer 232B (between views 4 and 5).

View 6 illustrates a forming of microcavities MK for microvias 128, for example using laser processing or drilling. In view 7, the microcavities MK are filled to form the microvias 128.

View 8 illustrates a structuring of the first metal layer 232T and the second metal layer 232B to form separate contact pads.

Alternatives to the illustrated method may for example include laminating the chip 124 without the first carrier 102, and/or laminating the chip 124 without the temporary carrier 236. In such a case, the chip 124 may be placed directly on the laminate layer 230, for example in an analogous way to what is illustrated in FIG. 4A for the forming of the semiconductor package 300.

As shown in particular in FIG. 6A to FIG. 6D, including a plurality of chips 124 may allow to create circuits directly within the pre-packaged chip 200. For example, including four MOSFETs in the pre-packaged chip 200 may be arranged and contacted in such a way that they form a full power stage of a two stages switched capacitor converter. In such an embodiment, two of the dies 124 may be flipped. By flipping the dies 124 with respect to each other, the interconnection between the MOSFETs can be done directly within the pre-packaged chip 200, and the parasitic elements and occupied space may be reduced to a minimum.

In various embodiments, the pre-packaged chip 200 may further include passive electronic components (not shown).

FIGS. 3A to 3C, 4A and 4B, and FIG. 5A to 5E illustrate how a pre-packaged chip 200 in accordance with various embodiments, and/or a pre-packaged chip 201 (which may be provided with an electrically conductive connection 330 extending between the first metal layer 224T and the second metal layer 224B) may be included, for example embedded, in a semiconductor package 300 in accordance with various embodiments. In various embodiments, the pre-packaged chip 201 may be used as a surface mount device (SMD).

The semiconductor package 300, e.g. a PCB, may in various embodiments include a stack arrangement of pre-packaged chips 200 inside its volume. An at least partially vertical current flow (see the illustrating lines 340 in FIG. 3B) and/or control of the heat flow (arrows in FIG. 3B; mind in particular the increased heat flow as compared to FIG. 1A) may thereby be made possible. The large arrows may indicate a thermal connection to a heat sink.

By embedding the pre-packaged chip 200 into the semiconductor package 300, limitations found for direct bare die PCB embedding regarding cost, manufacturability, reliability, material set and accountability may be overcome, while all key advantages of direct bare die PCB embedding may be kept.

The semiconductor package 300 may, in various embodiments, include a pre-packaged chip 200 in accordance with various embodiments, for example as described above.

The semiconductor package 300 may further include a third laminate layer 304 over the first metal layer 232T on the top side of the chip 124, a fourth laminate layer 304 over the second metal layer 232B on the bottom side of the chip 124, wherein the third laminate layer 304 and the fourth laminate layer 304 are laminated together to sandwich the pre-packaged chip 200 therebetween, a third metal layer 310T on the third laminate layer 304 and electrically contacted to the at least one electrical top contact 224T via at least one further top contact hole through the third laminate layer 304 and the at least one top contact hole through the first laminate layer 230, a fourth metal layer 310B on the fourth laminate layer 304 and electrically contacted to the at least one electrical bottom contact 224B via at least one further bottom contact hole through the fourth laminate layer 304 and the at least one bottom contact hole through the second laminate layer 230, and an electrical connection 330 from the third metal layer 310T to the fourth metal layer 310B via a contact hole (for example, a plated through-hole) extending from the third metal layer 310T to the fourth metal layer 310B.

In various embodiments, in which, as described above, the pre-packaged chip 200 is free from an electrically conductive connection between the first metal layer 224T and the second metal layer 224B extending through the pre-packaged chip 200, the electrical connection 330 from the third metal layer 310T to the fourth metal layer 310B may extend outside the pre-packaged chip 200, for example parallel to a vertical extent of the pre-packaged chip 200, for example as illustrated in FIG. 3B for the pre-packaged chip 200 shown in the bottom right corner of the illustrated semiconductor package 300.

In various embodiments, a semiconductor package 300 may include a pre-packaged chip 201 where an electrical connection 330 may extend through the pre-packaged chip 201. More precisely, the electrical connection 330 from the third metal layer 310T to the fourth metal layer 310B may extend through the pre-packaged chip 201 from the third metal layer 310T to the fourth metal layer 310B.

Such an embodiment is for example shown in FIG. 3A, in FIG. 3B in the middle of the semiconductor package 300, in FIG. 3C in the top left corner of the semiconductor package 300, in the respective third views of FIG. 4A and FIG. 4B, and in each of FIG. 5A to 5D.

The third laminate layer 304 and the fourth laminate layer 304 may include or consist of laminate material that does not need to fulfill the purity requirements that may be necessary for material that may be in direct contact with the chip 124.

Since the chip 124 is included into the semiconductor package 300 as part of the pre-packaged chip 200, the chip 124 may be protected from harmful influences by the laminating material 304 by the (pure) laminating material 230 of the pre-packaged chip 200, 201. For example, laminating materials as typically used in PCB manufacturing may be used for the semiconductor package 300, for example a resin material, for example a so-called prepreg material.

In various embodiments, the semiconductor package 300 with the pre-packaged chip 200 or with the pre-packaged chip 201 may include at least one further pre-packaged chip 200 or 201.

In other words, a further pre-packaged chip 200 (without the electrical connection extending through the pre-packaged chip 200) similar or identical to the pre-packaged chip 200, and/or a further pre-packaged chip 201 (with the electrical connection extending through the pre-packaged chip 200) similar or identical to the pre-packaged chip 201 may additionally be embedded in the semiconductor package 300.

In order to be able to refer to individual features of the respective pre-packaged chips 200, 201, the further pre-packaged chip 200 may be described as having the following features: a further chip 124 having at least one electrical top contact 224T at a top side of the chip 224 and at least one electrical bottom contact 224B at a bottom side opposite the top side, a further first laminate layer 230 on the top side, a further second laminate layer 230 on the bottom side, wherein the further first laminate layer 230 and the further second laminate layer 230 are laminated together to sandwich the further chip 124 therebetween, a further first metal layer 232T on the further first laminate layer 230 and electrically contacted to the at least one electrical top contact 224T via at least one top contact hole through the further first laminate layer 230, and a further second metal layer 232B on the second laminate layer 230 and electrically contacted to the at least one electrical bottom contact 224B via at least one bottom contact hole through the further second laminate layer 230.

The pre-packaged chip 200, 201 and the further pre-packaged chip 200, 201 may be in electrical contact with each other, for example through one or more of the first metal layer 232T, the second metal layer 232B, the third metal layer 210T, the fourth metal layer 210B, the further first metal layer 232T, the further second metal layer 232B, and one or more electrical connection(s) 330, e.g. through holes.

The pre-packaged chip 200, 201 and the further pre-packaged chip 200, 201 may be arranged with the same orientation or with a flipped orientation with respect to each other, or, if more than two pre-packaged chips 200, 201 are included within the semiconductor package 300, all with the same orientation or some with the same orientation and one or more with a flipped orientation. In FIG. 3B, the pre-packaged chips 200, 201 are only schematically indicated, therefore they are shown with an arrow indicating their respective tops. Thus, both of the upper pre-packaged chips 200 are arranged with their tops facing in different directions (the left pre-package 200 upwards and the right pre-package 200 downwards), whereas both bottom left pre-packaged chips 200 are arranged with their respective tops facing upwards.

In various embodiments, the pre-packaged chips 200, 201 may have different configuration(s) and/or different functionalities. In such a case, it may be undefined whether their relative arrangement may be defined as having the same orientation or a flipped orientation.

In FIG. 5D, two pre-packaged chips 201 are arranged with the same orientation.

In various embodiments, two or more pre-packaged chips 200, 201 may be arranged on top of each other, also referred to as a stacked configuration.

A stacked configuration is to be understood as a configuration in which the pre-packaged chip 200, 201 and the further pre-packaged chip 200, 201 are arranged in different vertical levels of a cross-sectional view.

Furthermore, the pre-packaged chip 200, 201 and the further pre-packaged chip 200, 201 may be arranged such a way that, in a top view (a view onto a main surface of the semiconductor package 300), the pre-packaged chip 200, 201 and the further pre-packaged chip 200, 201 are at least partially one on top of the other. In a cross-sectional view like FIG. 5D, the pre-packaged chip 200, 201 and the further pre-packaged chip 200, 201 may be arranged one at least partially (in FIG. 5D: completely) over the other. In other words, they may show lateral overlap.

In FIG. 3B, for example, the semiconductor package 300 includes two pre-packaged chips 200 in an upper half of the semiconductor package 300, and two pre-packaged chips 200 in a lower half of the semiconductor package 300. Thus, each of the pre-packaged chips 200 in the top half is in a stacked configuration with each of the bottom pre-packaged chips 200, and vice versa. The top right pre-packaged chip 200 overlaps both bottom pre-packaged chips 200, whereas the top left pre-packaged chip 200 overlaps only the left bottom pre-packaged chip 200.

In FIG. 3C, the two top pre-packaged chips 200 are in a stacked configuration with the bottom pre-packaged chip 200, but without overlap. Their configuration may also be referred to as a multi-level arrangement without overlap.

In various embodiments, the pre-packaged chip 200, 201 and the further pre-packaged chip 200, 201 are arranged in the semiconductor package 300 in a side-by-side configuration.

A side-by-side-configuration is to be understood as a configuration in which the pre-packaged chip 200, 201 and the further pre-packaged chip 200, 201 appear side-by-side in a top view of the semiconductor package 300. This applies for example to all pre-packaged chips 200, 201 of the semiconductor package 300 of FIG. 3C, and to the top pre-packaged chips 200, 201 of the semiconductor package 300 of FIG. 3B.

The pre-packaged chips 200, 201 in the side-by-side configuration may be on the same level (e.g., in the same plane) in the semiconductor package 300, like for example the top pre-packaged chips 200, 201 of the semiconductor package 300 of FIG. 3B, or on different levels (e.g., in different planes), like for example the top pre-packaged chips 200, 201 of the semiconductor package 300 of FIG. 3C and the bottom pre-packaged chip 200 of FIG. 3C.

In various embodiments, stacked and side-by-side pre-packaged chips 200, 201 may be present in a semiconductor package 300. Examples of such configurations are shown in FIG. 3B and FIG. 3C.

In various embodiments, further electronic components 126, for example passive components, may be included in the semiconductor package 300, for example mounted on the semiconductor package 300. The pre-packaged chips 200, 201 may in that case be in a stacked configuration with the further electronic components 126.

In various embodiments, the pre-packaged chips 200, 201, e.g. MOSFETs, may be arranged asymmetrically (with respect to a horizontal central plane) in the semiconductor package 300. For example, the pre-packaged chips 200, 201 may be arranged close to a surface of the semiconductor package 300.

The stacked and/or side-by-side configuration of the pre-packaged chips 200, 201 with respect to each other, the stacked configuration of the further components 126 with respect to the pre-packaged chips 200, 201, and/or the asymmetric arrangement of the pre-packaged chips 200, 201 inside the semiconductor package 300 may allow a shortening of the connection length and a minimization of parasitic elements, thereby increasing a performance of the semiconductor package 300.

As described above, the dies 124 may be protected inside a very low halogen content laminate material 230 (or other typically polymer based material) in the pre-packaged chip 200 or 201 and connected to the metallization (e.g. routing) layers 310T, 310B, 312T, 312B, etc., with (e.g. plated, e.g. Cu plated) microvias 128.

Therefore, it may be possible to route small size and small pitch chip contacts (also referred to as die pads) 224T, 224B to larger size and optimally located pads 310T, 310B, etc.

The more delicate and expensive processes and usage of (HDI-) PCB processes may be limited to the forming of the pre-packaged chip 200, 201, not the whole PCB 300, thereby significantly reducing the cost of the full solution.

In various embodiments, it may be possible to use thicker copper layers in the layers 310T, 310B, 312T, 312B, etc., of an essentially conventional PCB that may serve as a "body" for the pre-packaged chip 200, than in a HDI PCB. Thus, ohmic losses in the relative long current paths in the system may be reduced in the semiconductor package 300 in accordance with various embodiments.

In various embodiments, several semiconductor dies 124 of different dimensions (within certain design rules) may be used in the pre-packaged chip 200, 201. Thereby, a high flexibility with respect to combining different types of components (e.g. power semiconductors of different voltage classes, semiconductor materials, ICs and even passive components) may be provided.

In various embodiments, it may be possible to build pre-packaged chips 200, 201 of varying complexity, ranging from single devices to component parallelization, arrays of dies or, very importantly, functional blocks (e.g. a half-bridge in combination with a driver, a full-bridge, a multi-level arrangement, etc.).

The embedding of the pre-packaged chips 200, 201 in accordance with various embodiments makes an enormous optimization of the power loop (i.e. reduction of undesired parasitic components) possible, due to the great flexibility it introduces (for example by implementing vertical current flow or minimizing areas of the loop without interfering with placement and layout of other components). The above-mentioned functional blocks may be designed and tuned for the exact components they contain in such a way that they produce an optimum and predictable response.

In various embodiments, the first metallization layer 310T and the second metallization layer 310B (routing layers) both on top and bottom of the pre-packaged chips 200, 210 may allow to redirect the generated heat, depending on a specific design of the pre-packaged chip 200, 201 and of semiconductor package 300 (the PCB) to one way/side, to the other way/side, or to both ways, depending on what is more convenient in each case.

In various embodiments, different process types may be used for manufacturing the semiconductor package 300, for example a conventional multilayer process (exemplary embodiments are shown in FIG. 5B and FIG. 5C) or a HDI build up process (an exemplary embodiment of which is shown in FIG. 5A).

The pre-packaged chips 200, 201 may in various embodiments be embedded inside different layers of a HDI build up process. In such a case, the pre-packaged chips 200, 201 may be embedded in the middle of the semiconductor package 300, i.e. a multilayer board.

In the embodiment shown in FIG. 5A, the pre-packaged chip 201 is placed in an opening of the second carrier 302 between the third laminate layer 304 (over the first metal layer 232T on the top side of the chip 124) and the fourth laminate layer 304 (over the second metal layer 232B on the bottom side of the chip 124), see view 1 of FIG. 5A.

The pre-packaged chip 200, 201 may be placed inside the cavity of the second carrier 302 either by laminating the temporary carrier 236 onto the bottom side of the second carrier 302 and attaching the pre-packaged chip 200, 201 accurately with e.g. a pick and placement machine to the tape.

The third laminate layer 304 and the fourth laminate layer 304 may be laminated together to sandwich the pre-packaged chip 201 therebetween. The third metal layer 310T (on the third laminate layer 304) and the fourth metal layer 310B on the fourth laminate layer 304 may be laminated onto the third and the fourth laminate layer 304, respectively, together with the third and the fourth laminate layer 304.

Lamination may essentially be done in two successive processes, first laminating prepreg 304 and a copper layer 310T on top of the pre-packaged chip 200, 201, and after removing the temporary carrier 236, laminating prepreg and another copper layer 310B to the bottom side.

Using this process, the pre-packaged chip 200, 201 may be accurately positioned, such that the pad sizes for the µ vias 128 and PTHs 330 may be relatively small.

In various other embodiments, the second carrier 302 may be arranged with its cavity above the copper foil 310B and prepreg 304. The pre-packaged chip 200, 201 may be placed manually or using an assembly machine inside the opening. The second prepreg 304 and copper foil 310T may subsequently be placed on top, and the whole stack may be laminated together In various embodiments, the opening in the second carrier 302 may be slightly larger than the pre-packaged chip 200, 201, and because the pre-packaged chip 200, 201 may move by about 50 µm to about 100 µm, the pad sizes for the microvias 128 and the PTHs 330 may have to be slightly larger.

In various embodiments, the pre-packaged chip 200, 201 may be placed inside a cavity on top of the final semiconductor package 300, such that the top side of the pre-packaged chip 200, 201 is approx. on the same level as the surrounding surface of the semiconductor package 300. The pre-packaged chip 200, 201 may be visible from a top side of the semiconductor package 300. The connections between the pre-packaged chip 200, 201 and the final semiconductor package 300 may be formed by plated microvias, plated through holes (PTH) 330, or even by soldering.

Because the pre-packaged chip 201 is embedded inside the semiconductor package 300, and is connected using microvias 128 and/or PTHs 330, neither a surface finishing nor a solder masking may be necessary. A surface treatment for improving an adhesion to the laminate layer 304 may be applied, for example an arranging of an adhesion layer, a plasma treatment, or other suitable processes as known in the art.

Electrical contacts from the third metal layer 310T to the at least one electrical top contact 224T via at least one further top contact hole through the third laminate layer 304 and the at least one top contact hole through the first laminate layer 230, and from the fourth metal layer 310B to the at least one electrical bottom contact 224B via at least one further bottom contact hole through the fourth laminate layer 304 and the at least one bottom contact hole through the second laminate layer 230 may be arranged after the laminating the third and the fourth laminate layer 304 and the third and the fourth metal layer 310T, 310B, and before laminating further laminate layers 304 and further metal layers 312T, 312B, yet further laminate layers 304 and yet further metal layers 314T, 314B, etc. successively from an outside onto the semiconductor package 300. The electrical connection may include through holes 330 in various suitable positions of the semiconductor package 300, and structuring of the metal layers, e.g. 310T, 310B, 312T, 312B, 314T, 314B, 316T, 316B, 318T, 318B, etc., in order to avoid short contacts.

In various embodiments that use the essentially conventional multilayer process for manufacturing the semiconductor package 300, the pre-packaged chip 200, 201 may be embedded between different layers besides the central layers.

Furthermore, the multilayer PCB process may even allow to embed several pre-packaged chips 200, 201 in different layers of the semiconductor package 300.

In the exemplary embodiment of FIG. 5B, the pre-packaged chip 201 is placed in an opening of the second carrier 302 between the third laminate layer 304 (over the first metal layer 232T on the top side of the chip 124) and the fourth laminate layer 304 (over the second metal layer 232B on the bottom side of the chip 124), see view 1 of FIG. 5B.

The third laminate layer 304 and the fourth laminate layer 304 may be laminated together to sandwich the pre-packaged chip 201 therebetween. The third metal layer 310T (on the third laminate layer 304) and the fourth metal layer 310B on the fourth laminate layer 304 may be laminated onto the third and the fourth laminate layer 304, respectively, together with the third and the fourth laminate layer 304. This process may occur between view 1 and view 2 of FIG. 5B. Up until here, the essentially conventional multilayer process may be similar or identical to the HDI build up process.

However, a further processing may be asymmetric. In the exemplary embodiment of FIG. 5B, a further carrier 302 may be arranged over the third metal layer 310T and may be laminated onto the third metal layer 310T by a further laminate layer 304 placed between the third metal layer 310T and the further carrier 302.

Yet further metal layers 312B, 312T, 314B, 314T, 316T, 318T and yet further laminate layers 304 may be laminated onto the semiconductor package 300 as required.

Electrical contacts, e.g. vertical contacts using through holes 330 etc., and horizontal contacts using the structured metal layers 310T, 310B, 312T, 312B, 314T, 314B, 316T, 316B, 318T, 318B, etc., may be formed in a similar way as described above with respect to FIG. 5A.

FIG. 5C illustrates another exemplary embodiment of a multilayer PCB process similar to the process of FIG. 5B, therefore a repetitive description of the processes is omitted.

The semiconductor package 300 formed by the process illustrated in FIG. 5C may differ from the process in FIG. 5B mostly by providing two additional second carriers 302, thus three second carriers 302 in total.

Also the semiconductor package 300 of FIG. 5D may have been manufactured using a process as illustrated in FIG. 5B and/or FIG. 5C, with the difference that two pre-packaged chips 201 are embedded in the semiconductor package 300.

FIG. 7 illustrates (as rough sketches; for identification of elements of the respective semiconductor packages, please refer to the more detailed figures) various configurations that may be realized by a semiconductor package 300 having eight metallization layers (e.g., an eight layer board), together with an impact that using the method of manufacturing the semiconductor package 300 in accordance with various embodiments may have on costs, a design, and on the process itself, wherein a "+" indicates a beneficial impact (the more, the better), and a "−" indicates a negative impact (the more, the worse).

In case the HDI build up process is used, the pre-packaged chip 200, 201 is embedded inside the second carrier (the core layer) 302 that is located in the middle of the multilayer PCB. Additional buildup layers are laminated on top of the core layer one by one, and between each process step, a drilling of the microvias 128, a PTH 330 drilling, a plating, a lithography process and an etching process may be needed. In case of the eight layer PCB structure, three process cycles may be required.

If the essentially conventional multilayer PCB process is used, two or three core layers 302 may be laminated above each other, and the connections between the layers may be formed with PTH 330 and, if necessary, by microvias 128.

An advantage of the conventional multilayer PCB process may be that less expensive build up layer processes are use. However, a disadvantage may be that the connections between the different inner layers must be done with plated through holes (PTH) 330.

Various implementations may be provided using the inlay concept. Depending on the system architecture and circuit topology, the design and arrangement of the pre-packaged chip 200, 201 (which may form a power inlay) may vary.

The pre-packaged chip 200, 201 may be formed by a single die 124 embedded into one laminate (the lamination layers 304, the third metallization layer 310T, and the fourth metallization layer 310B), as for example shown in FIG. 4A or 4B.

However, the concept may not limited to any number of dies 124 in the same pre-packaged chip 200, 201, which makes the inlay concept an innovative solution for power stages with complicated designs.

Power density increases usually correlate with a reduction of the layout area. Therefore, the space for power flow decreases leading to higher DC parasitic resistance and ohmic loss ($I^2 R$). In a design using conventional SMD components, for example as shown in FIG. 1A, the power path typically consist of segments of lateral current flow (PCB traces and SMD components) in series with segments of vertical current flow (e.g. through vias).

The use of power inlays may enable a much higher share of vertical current flow segments. See for example the semiconductor package 300 of FIG. 3B, in particular in comparison to FIG. 1A. The vertical distances may be much shorter than the lateral ones, so the current flow through much shorter paths, the parasitic elements of the power loop (both L and R) are greatly reduced, and so are power losses.

Figure 6A:
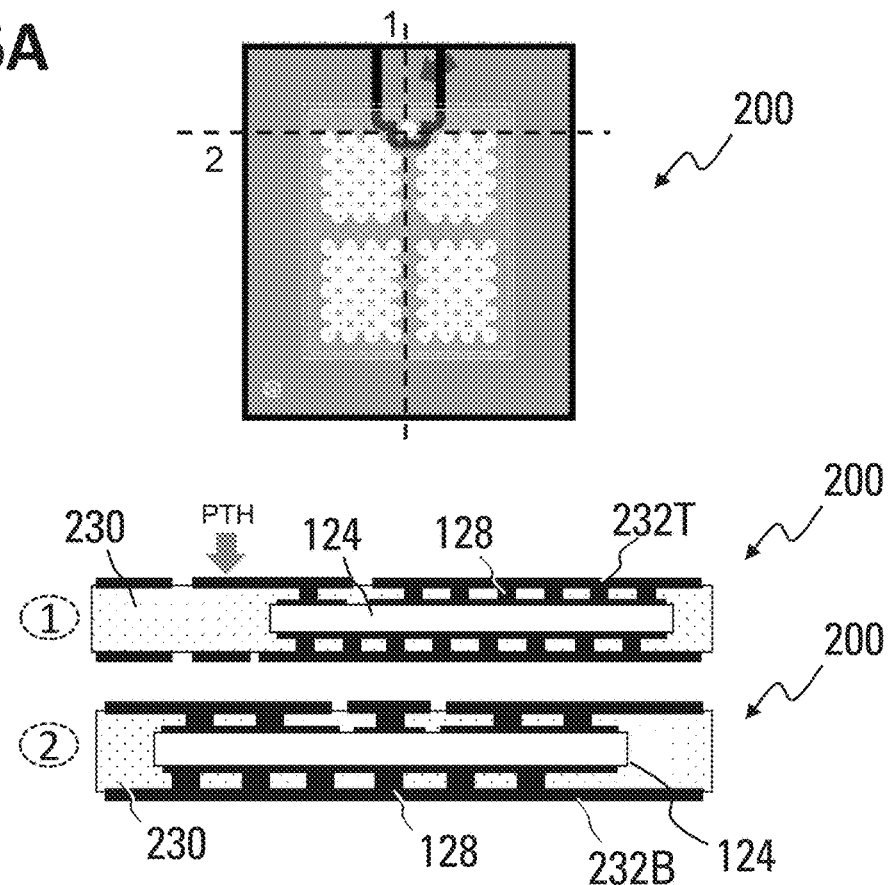
Figure 6B:
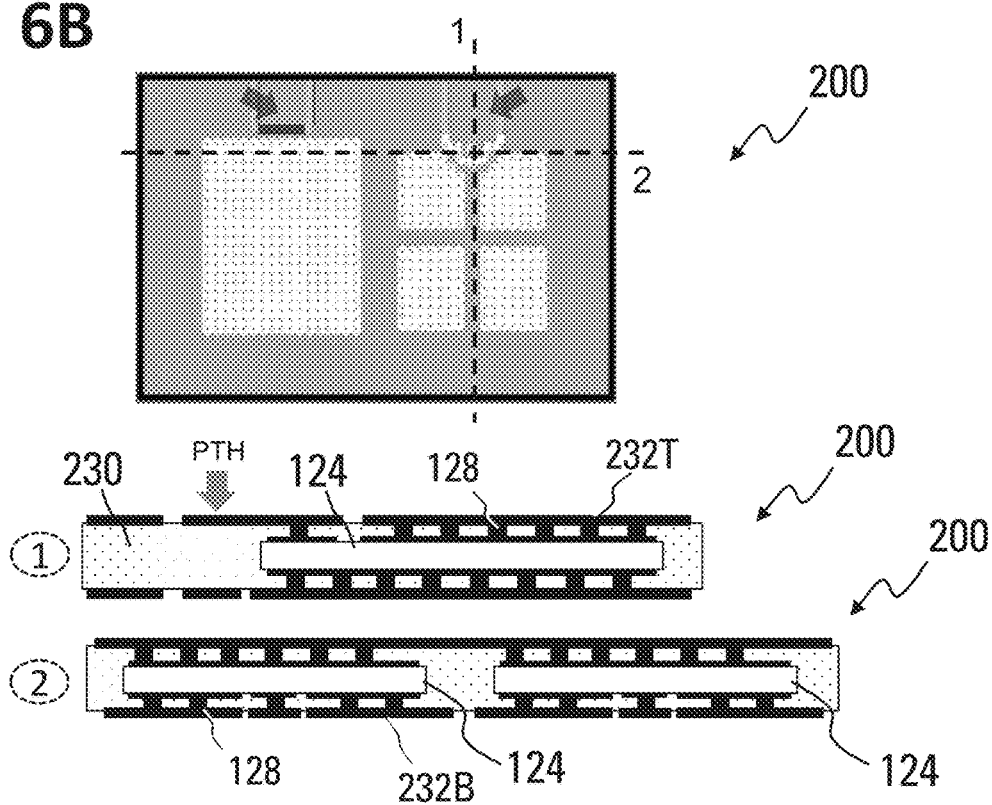
Figure 6C:
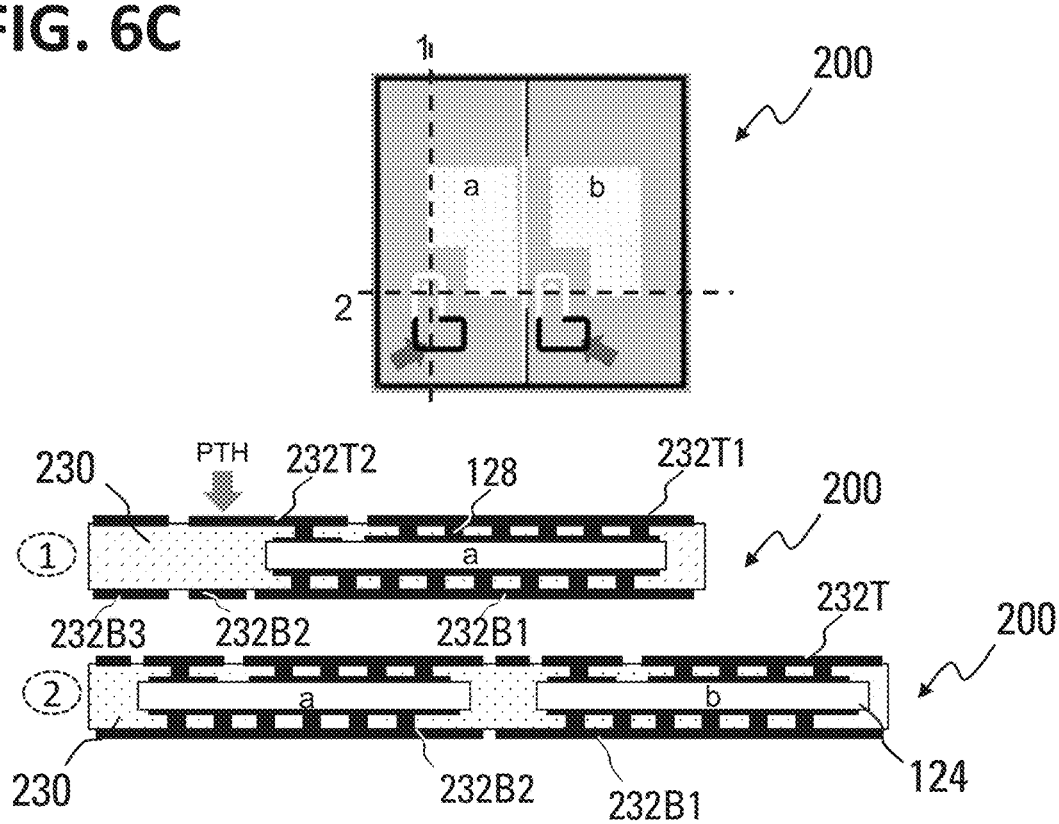
Figure 6D:
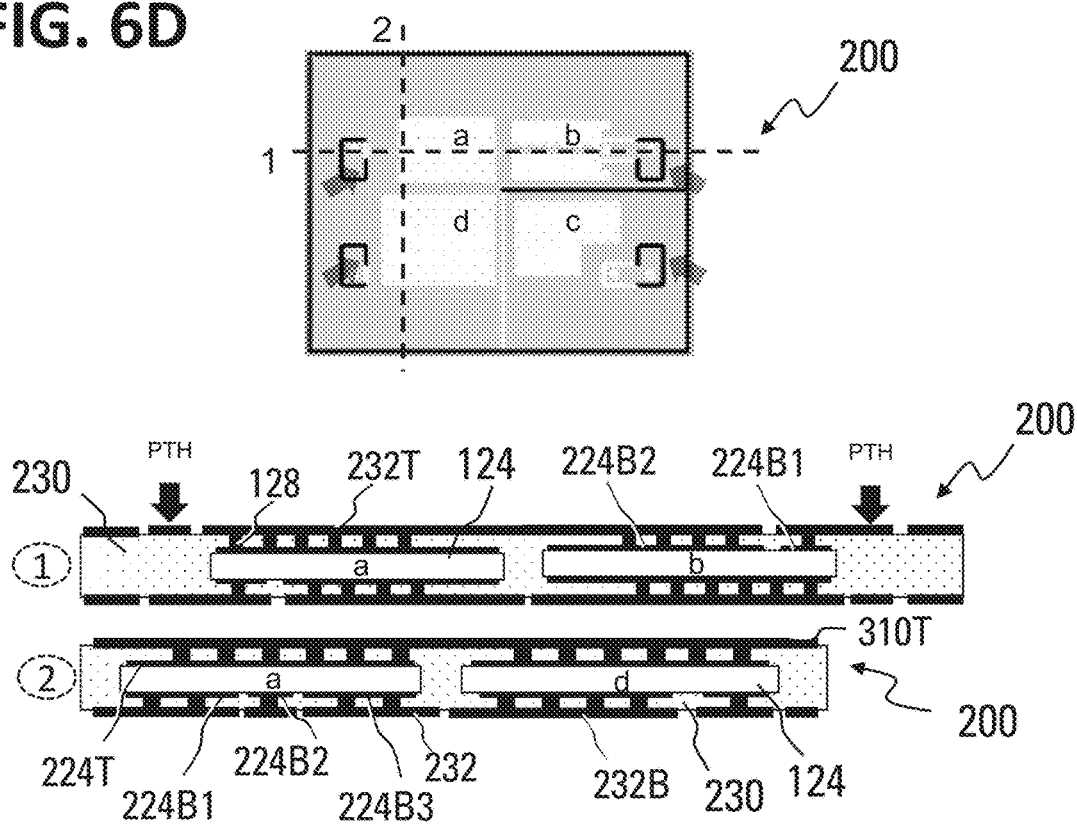

In various embodiments, two MOSFETs dies 124 may be embedded into one pre-packaged chip 200, 201, as for example illustrated in FIGS. 6B, 6C, and 6D. A direct vertical access to switches, source- and drain terminals may be possible, and it may be possible to position the pre-packaged chip 200, 201 inside the semiconductor package 300 below the other components 126 it connects to (see, e.g., FIG. 3B) so the current flows vertically and through minimal distances.

Four MOSFET dies 124 may for example be embedded into the same pre-packaged chip 200, 201 to create a full power stage of a two stages switched capacitor converter. In such an exemplary embodiment, two of the dies 124 may be flipped. By flipping the dies 124, the interconnection between the MOSFETs 124 may be formed directly at the pre-packaged chip 200, 201, and the parasitic elements and occupied space may be reduced to a minimum.

Four MOSFET dies 124 may for example be embedded into the same pre-packaged chip 200, 201 to create a two stages switched capacitor converter. By flipping the dies 124, the interconnection between the MOSFETs 124 may be formed directly at the pre-packaged chip 200, 201, and the parasitic elements and occupied space may be reduced to a minimum.

FIG. 8 is a flow diagram 800 of a method of manufacturing a pre-packaged chip in accordance with various embodiments;

The method may include laminating a first laminate layer and a second laminate layer together, thereby sandwiching a chip having at least one electrical top contact at a top side of the chip and at least one electrical bottom contact at a bottom side opposite the top side (810), forming at least one top contact hole through the first laminate layer (820), forming a first metal layer on the first laminate layer and electrically contacting the first metal layer to the at least one electrical top contact via the top contact hole (830), forming at least one bottom contact hole through the second laminate layer (840), and forming a second metal layer on the second laminate layer and electrically contacting the second metal layer to the at least one electrical bottom contact via at least one bottom contact hole, wherein the pre-packaged chip is free from any contact hole extending from the first metal layer to the second metal layer (850).

FIG. 9 is a flow diagram 900 of a method of manufacturing a semiconductor package in accordance with various embodiments.

The method may include forming the pre-packaged chip in accordance with various embodiments (910), laminating a third laminate layer over the first metal layer on the top side of the chip and a fourth laminate layer over the second metal layer on the bottom side of the chip together to sandwich the pre-packaged chip therebetween (920), forming at least one further top contact hole through the third laminate layer (930), forming a third metal layer on the third laminate layer electrically contacting the at least one electrical top contact via the at least one further top contact hole and the at least one top contact hole (940), forming a fourth metal layer on the fourth laminate layer electrically contacting the at least one electrical bottom contact via the at least one further bottom contact hole and the at least one bottom contact hole (950), and forming an electrical connection from the third metal layer to the fourth metal layer via a contact hole extending from the third metal layer to the fourth metal layer (960).

FIG. 10 is a flow diagram 1000 of a method of manufacturing a semiconductor package in accordance with various embodiments.

The method may include forming a pre-packaged chip, including laminating a first laminate layer and a second laminate layer together, thereby sandwiching a chip having at least one electrical top contact at a top side of the chip and at least one electrical bottom contact at a bottom side opposite the top side, forming at least one top contact hole through the first laminate layer, forming a first metal layer on the first laminate layer and electrically contacting the first metal layer to the at least one electrical top contact via the top contact hole, forming at least one bottom contact hole through the second laminate layer, forming a second metal layer on the second laminate layer, and electrically contacting the second metal layer to the at least one electrical bottom contact via at least one bottom contact hole (1010), laminating a third laminate layer over the first metal layer on the top side of the chip and a fourth laminate layer over the second metal layer on the bottom side of the chip together to sandwich the pre-packaged chip therebetween (1020), forming at least one further top contact hole through the third laminate layer (1030), forming a third metal layer on the third laminate layer electrically contacting the at least one electrical top contact via the at least one further top contact hole and the at least one top contact hole (1040), forming a fourth metal layer on the fourth laminate layer electrically contacting the at least one electrical bottom contact via the at least one further bottom contact hole and the at least one bottom contact hole (1050), and forming an electrical connection from the third metal layer to the fourth metal layer via a contact hole extending through the pre-packaged chip from the third metal layer to the fourth metal layer (1060).

FIG. 11 is a flow diagram 1100 of a method of manufacturing a semiconductor package in accordance with various embodiments.

The method may include forming a pre-packaged chip, including laminating a first laminate layer and a second laminate layer together, thereby sandwiching a chip having at least one electrical top contact at a top side of the chip and at least one electrical bottom contact at a bottom side opposite the top side, forming at least one top contact hole through the first laminate layer, forming a first metal layer on the first laminate layer and electrically contacting the first metal layer to the at least one electrical top contact via the top contact hole, forming at least one bottom contact hole through the second laminate layer, forming a second metal layer on the second laminate layer and electrically contacting the second metal layer to the at least one electrical bottom contact via at least one bottom contact hole (1110), laminating a third laminate layer over the first metal layer on the top side of the chip and a fourth laminate layer over the second metal layer on the bottom side of the chip together to sandwich the pre-packaged chip therebetween (1120), forming at least one further top contact hole through the third laminate layer (1130), forming a third metal layer on the third laminate layer electrically contacting the at least one electrical top contact via the at least one further top contact hole and the at least one top contact hole (1140), forming a fourth metal layer on the fourth laminate layer electrically contacting the at least one electrical bottom contact via the at least one further bottom contact hole and the at least one bottom contact hole (1150), and forming an electrical connection from the third metal layer to the fourth metal layer via a contact hole extending from the third metal layer to the fourth metal layer (1160), further comprising embedding at least one further pre-packaged chip in the semiconductor package, the further pre-packaged chip including a further chip having at least one electrical top contact at a top side of the chip and at least one electrical bottom contact at a bottom side opposite the top side, a further first laminate layer on the top side, a further second laminate layer on the bottom side, wherein the further first laminate layer and the further second laminate layer are laminated together to sandwich the further chip therebetween, a further first metal layer on the further first laminate layer and electrically contacted to the at least one electrical top contact via at least one top contact hole through the further first laminate layer, and a further second metal layer on the second laminate layer and electrically contacted to the at least one electrical bottom contact via at least one bottom contact hole through the further second laminate layer (1170).

Various examples will be illustrated in the following:

Example 1 is a pre-packaged chip. The pre-packaged chip may include a chip having at least one electrical top contact at a top side of the chip and at least one electrical bottom contact at a bottom side opposite the top side, a first laminate layer on the top side, a second laminate layer on the bottom side, wherein the first laminate layer and the second laminate layer are laminated together to sandwich the chip therebetween, a first metal layer on the first laminate layer and electrically contacted to the at least one electrical top contact via at least one top contact hole through the first laminate layer, and a second metal layer on the second laminate layer and electrically contacted to the at least one electrical bottom contact via at least one bottom contact hole through the second laminate layer, wherein the pre-packaged chip is free from any contact hole extending from the first metal layer to the second metal layer.

In Example 2, the subject-matter of Example 1 may optionally include that the first laminate layer has a similar, e.g. the same, thickness as the second laminate layer.

In Example 3, the subject-matter of Example 1 or 2 may optionally include that the first metal layer has a similar, e.g. the same, thickness as the second metal layer.

In Example 4, the subject-matter of any of Examples 1 to 3 may optionally include that the first laminate layer includes or consists of a similar, e.g. the same, material as the second laminate layer.

In Example 5, the subject-matter of any of Examples 1 to 4 may optionally include that the first metal layer includes or consists of a similar, e.g. the same, material as the second metal layer.

In Example 6, the subject-matter of any of Examples 1 to 5 may optionally include that the pre-package includes at least one further chip sandwiched between the first laminate layer and the second laminate layer.

In Example 7, the subject-matter of Example 6 may optionally include that the chip and the further chip are arranged with their respective top contacts facing the same side of the pre-packaged chip.

In Example 8, the subject-matter of Example 6 may optionally include that the chip and the further chip are arranged with their respective top contacts facing opposite sides of the pre-packaged chip.

Example 9 is a semiconductor package. The semiconductor package may include the pre-packaged chip of any of Examples 1 to 8, a third laminate layer over the first metal layer on the top side of the chip, a fourth laminate layer over the second metal layer on the bottom side of the chip, wherein the third laminate layer and the fourth laminate layer are laminated together to sandwich the pre-packaged chip therebetween, a third metal layer on the third laminate layer and electrically contacted to the at least one electrical top contact via at least one further top contact hole through the third laminate layer and the at least one top contact hole through the first laminate layer, a fourth metal layer on the fourth laminate layer and electrically contacted to the at least one electrical bottom contact via at least one further bottom contact hole through the fourth laminate layer and the at least one bottom contact hole through the second laminate layer, and an electrical connection from the third metal layer to the fourth metal layer via a contact hole extending from the third metal layer to the fourth metal layer.

Example 10 is a semiconductor package including a pre-packaged chip including a chip having at least one electrical top contact at a top side of the chip and at least one electrical bottom contact at a bottom side opposite the top side, a first laminate layer on the top side, a second laminate layer on the bottom side, wherein the first laminate layer and the second laminate layer are laminated together to sandwich the chip therebetween, a first metal layer on the first laminate layer and electrically contacted to the at least one electrical top contact via at least one top contact hole through the first laminate layer, and a second metal layer on the second laminate layer and electrically contacted to the at least one electrical bottom contact via at least one bottom contact hole through the second laminate layer, a third laminate layer over the first metal layer on the top side of the chip, and a fourth laminate layer over the second metal layer on the bottom side of the chip, wherein the third laminate layer and the fourth laminate layer are laminated together to sandwich the pre-packaged chip therebetween, a third metal layer on the third laminate layer and electrically contacted to the at least one electrical top contact via at least one further top contact hole through the third laminate layer and the at least one top contact hole through the first laminate layer, a fourth metal layer on the fourth laminate layer and electrically contacted to the at least one electrical bottom contact via at least one further bottom contact hole through the fourth laminate layer and the at least one bottom contact hole through the second laminate layer, and an electrical connection from the third metal layer to the fourth metal layer via a contact hole extending through the pre-packaged chip from the third metal layer to the fourth metal layer.

In Example 11, the subject-matter of Examples 9 or 10 may optionally further include a further pre-packaged chip embedded in the semiconductor package, the further pre-packaged chip including a further chip having at least one electrical top contact at a top side of the chip and at least one electrical bottom contact at a bottom side opposite the top side, a further first laminate layer on the top side, a further second laminate layer on the bottom side, wherein the further first laminate layer and the further second laminate layer are laminated together to sandwich the further chip therebetween, a further first metal layer on the further first laminate layer and electrically contacted to the at least one electrical top contact via at least one top contact hole through the further first laminate layer, and a further second metal layer on the second laminate layer and electrically contacted to the at least one electrical bottom contact via at least one bottom contact hole through the further second laminate layer.

Example 12 is a semiconductor package including a pre-packaged chip, including a chip having at least one electrical top contact at a top side of the chip and at least one electrical bottom contact at a bottom side opposite the top side, a first laminate layer on the top side, a second laminate layer on the bottom side, wherein the first laminate layer and the second laminate layer are laminated together to sandwich the chip therebetween, a first metal layer on the first laminate layer and electrically contacted to the at least one electrical top contact via at least one top contact hole through the first laminate layer, and a second metal layer on the second laminate layer and electrically contacted to the at least one electrical bottom contact via at least one bottom contact hole through the second laminate layer, a third laminate layer over the first metal layer on the top side of the chip, a fourth laminate layer over the second metal layer on the bottom side of the chip, wherein the third laminate layer and the fourth laminate layer are laminated together to sandwich the pre-packaged chip therebetween, a third metal layer on the third laminate layer and electrically contacted to the at least one electrical top contact via at least one further top contact hole through the third laminate layer and the at least one top contact hole through the first laminate layer, a fourth metal layer on the fourth laminate layer and electrically contacted to the at least one electrical bottom contact via at least one further bottom contact hole through the fourth laminate layer and the at least one bottom contact hole through the second laminate layer, and an electrical connection from the third metal layer to the fourth metal layer via a contact hole extending from the third metal layer to the fourth metal layer, further including at least one further pre-packaged chip embedded in the semiconductor package, the further pre-packaged chip including a further chip having at least one electrical top contact at a top side of the chip and at least one electrical bottom contact at a bottom side opposite the top side, a further first laminate layer on the top side, a further second laminate layer on the bottom side, wherein the further first laminate layer and the further second laminate layer are laminated together to sandwich the further chip therebetween, a further first metal layer on the further first laminate layer and electrically contacted to the at least one electrical top contact via at least one top contact hole through the further first laminate layer, and a further second metal layer on the second laminate layer and electrically contacted to the at least one electrical bottom contact via at least one bottom contact hole through the further second laminate layer.

In Example 13, the subject-matter of Example 12 may optionally include that the further first metal layer is electrically contacted to the third metal layer and/or the further second metal layer is electrically contacted to the fourth metal layer.

In Example 14, the subject-matter of Example 12 may optionally include that the further first metal layer is electrically contacted to the fourth metal layer and/or the further second metal layer is electrically contacted to the third metal layer.

In Example 15, the subject-matter of any of Examples 12 to 14 may optionally include that the electrical connection from the third metal layer to the fourth metal layer extends through the pre-packaged chip.

In Example 16, the subject-matter of any of Examples 12 to 14 may optionally include that the pre-packaged chip is free from any contact hole extending from the first metal layer to the second metal layer.

In Example 17, the subject-matter of any of Examples 12 to 16 may optionally include that the pre-package includes at least one further chip sandwiched between the first laminate layer and the second laminate layer.

In Example 18, the subject-matter of any of Examples 12 to 17 may optionally include that the pre-packaged chip and the further pre-packaged chip are arranged, in a top view of the semiconductor package, side-by-side.

In Example 19, the subject-matter of any of Examples 12 to 17 may optionally include that the pre-packaged chip and the further pre-packaged chip are arranged, in a top view of the semiconductor package, one at least partially on top of the other.

In Example 20, the subject-matter of any of Examples 12 to 17 may optionally include that the at least one further pre-packaged chip includes a plurality of pre-packaged chips, and that the pre-packaged chip and one of the plurality of pre-packaged chips are arranged, in a top view of the semiconductor package, side-by-side, and at least partially on top of another of the plurality of pre-packaged chips.

In Example 21, the subject-matter of any of Examples 9 to 20 may optionally include that the fourth metal layer includes a first portion that is electrically contacted to the at least one electrical bottom contact, and a second portion that is electrically contacted to the electrical connection from the third metal layer to the fourth metal layer, and that the first portion is electrically isolated from the second portion.

In Example 22, the subject-matter of any of Examples 9 to 21 may optionally include that the pre-packaged chip further includes a first carrier including a first opening, wherein the chip is arranged in the first opening.

In Example 23, the subject-matter of any of Examples 9 to 22 may optionally include a second carrier including a second opening, wherein the pre-packaged chip is arranged in the second opening.

Example 24 is a method of manufacturing a pre-packaged chip. The method may include laminating a first laminate layer and a second laminate layer together, thereby sandwiching a chip having at least one electrical top contact at a top side of the chip and at least one electrical bottom contact at a bottom side opposite the top side, forming at least one top contact hole through the first laminate layer, forming a first metal layer on the first laminate layer and electrically contacting the first metal layer to the at least one electrical top contact via the top contact hole, forming at least one bottom contact hole through the second laminate layer, and forming a second metal layer on the second laminate layer and electrically contacting the second metal layer to the at least one electrical bottom contact via at least one bottom contact hole, wherein the pre-packaged chip is free from any contact hole extending from the first metal layer to the second metal layer.

In Example 25, the subject-matter of Example 24 may optionally include that the first laminate layer has a similar, e.g. the same, thickness as the second laminate layer, and/or that the first metal layer has a similar, e.g. the same, thickness as the second metal layer.

Example 26 is a method of manufacturing a semiconductor package. The method may include forming the pre-packaged chip in accordance with Example 24, laminating a third laminate layer over the first metal layer on the top side of the chip and a fourth laminate layer over the second metal layer on the bottom side of the chip together to sandwich the pre-packaged chip therebetween, forming at least one further top contact hole through the third laminate layer, forming a third metal layer on the third laminate layer electrically contacting the at least one electrical top contact via the at least one further top contact hole and the at least one top contact hole, forming a fourth metal layer on the fourth laminate layer electrically contacting the at least one electrical bottom contact via the at least one further bottom contact hole and the at least one bottom contact hole, and forming an electrical connection from the third metal layer to the fourth metal layer via a contact hole extending from the third metal layer to the fourth metal layer.

Example 27 is a method of manufacturing a semiconductor package. The method may include forming a pre-packaged chip, including laminating a first laminate layer and a second laminate layer together, thereby sandwiching a chip having at least one electrical top contact at a top side of the chip and at least one electrical bottom contact at a bottom side opposite the top side, forming at least one top contact hole through the first laminate layer, forming a first metal layer on the first laminate layer and electrically contacting the first metal layer to the at least one electrical top contact via the top contact hole, forming at least one bottom contact hole through the second laminate layer, forming a second metal layer on the second laminate layer, and electrically contacting the second metal layer to the at least one electrical bottom contact via at least one bottom contact hole, laminating a third laminate layer over the first metal layer on the top side of the chip and a fourth laminate layer over the second metal layer on the bottom side of the chip together to sandwich the pre-packaged chip therebetween, forming at least one further top contact hole through the third laminate layer, forming a third metal layer on the third laminate layer electrically contacting the at least one electrical top contact via the at least one further top contact hole and the at least one top contact hole, forming a fourth metal layer on the fourth laminate layer electrically contacting the at least one electrical bottom contact via the at least one further bottom contact hole and the at least one bottom contact hole, and forming an electrical connection from the third metal layer to the fourth metal layer via a contact hole extending through the pre-packaged chip from the third metal layer to the fourth metal layer.

In Example 28, the subject-matter of any of Examples 25 to 27 may optionally include that the pre-package includes at least one further chip sandwiched between the first laminate layer and the second laminate layer.

In Example 29, the subject-matter of any of Examples 25 to 28 may optionally include embedding at least one further pre-packaged chip in the semiconductor package, the further pre-packaged chip including a further chip having at least one electrical top contact at a top side of the chip and at least one electrical bottom contact at a bottom side opposite the top side, a further first laminate layer on the top side, a further second laminate layer on the bottom side, wherein the further first laminate layer and the further second laminate layer are laminated together to sandwich the further chip therebetween, a further first metal layer on the further first laminate layer and electrically contacted to the at least one electrical top contact via at least one top contact hole through the further first laminate layer, and a further second metal layer on the second laminate layer and electrically contacted to the at least one electrical bottom contact via at least one bottom contact hole through the further second laminate layer.

Example 30 is a method of manufacturing a semiconductor package. The method may include forming a pre-packaged chip, including laminating a first laminate layer and a second laminate layer together, thereby sandwiching a chip having at least one electrical top contact at a top side of the chip and at least one electrical bottom contact at a bottom side opposite the top side, forming at least one top contact hole through the first laminate layer, forming a first metal layer on the first laminate layer and electrically contacting the first metal layer to the at least one electrical top contact via the top contact hole, forming at least one bottom contact hole through the second laminate layer, forming a second metal layer on the second laminate layer and electrically contacting the second metal layer to the at least one electrical bottom contact via at least one bottom contact hole, laminating a third laminate layer over the first metal layer on the top side of the chip and a fourth laminate layer over the second metal layer on the bottom side of the chip together to sandwich the pre-packaged chip therebetween, forming at least one further top contact hole through the third laminate layer, forming a third metal layer on the third laminate layer electrically contacting the at least one electrical top contact via the at least one further top contact hole and the at least one top contact hole, forming a fourth metal layer on the fourth laminate layer electrically contacting the at least one electrical bottom contact via the at least one further bottom contact hole and the at least one bottom contact hole, and forming an electrical connection from the third metal layer to the fourth metal layer via a contact hole extending from the third metal layer to the fourth metal layer, further comprising embedding at least one further pre-packaged chip in the semiconductor package, the further pre-packaged chip including a further chip having at least one electrical top contact at a top side of the chip and at least one electrical bottom contact at a bottom side opposite the top side, a further first laminate layer on the top side, a further second laminate layer on the bottom side, wherein the further first laminate layer and the further second laminate layer are laminated together to sandwich the further chip therebetween, a further first metal layer on the further first laminate layer and electrically contacted to the at least one electrical top contact via at least one top contact hole through the further first laminate layer, and a further second metal layer on the second laminate layer and electrically contacted to the at least one electrical bottom contact via at least one bottom contact hole through the further second laminate layer.

In Example 31, the subject-matter of Example 30 may optionally further include electrically contacting the further first metal layer to the third metal layer and/or electrically contacting the further second metal layer to the fourth metal layer.

In Example 32, the subject-matter of Example 30 may optionally further include electrically contacting the further first metal layer to the fourth metal layer and/or electrically contacting the further second metal layer to the third metal layer.

In Example 33, the subject-matter of any of Examples 30 to 32 may optionally include that the electrical connection from the third metal layer to the fourth metal layer extends through the pre-packaged chip.

In Example 34, the subject-matter of any of Examples 30 to 33 may optionally include that the pre-packaged chip is free from any contact hole extending from the first metal layer to the second metal layer.

In Example 35, the subject-matter of any of Examples 30 to 34 may optionally include that the pre-package includes at least one further chip sandwiched between the first laminate layer and the second laminate layer In Example 36, the subject-matter of any of Examples 30 to 35 may optionally include that the pre-packaged chip and the further pre-packaged chip are arranged, in a top view of the semiconductor package, side-by-side.

In Example 37, the subject-matter of any of Examples 30 to 35 may optionally include that the pre-packaged chip and the further pre-packaged chip are arranged, in a top view of the semiconductor package, one at least partially on top of the other.

In Example 38, the subject-matter of any of Examples 30 to 35 may optionally include that the at least one further pre-packaged chip includes a plurality of pre-packaged chips, and that the pre-packaged chip and one of the plurality of pre-packaged chips are arranged, in a top view of the semiconductor package, side-by-side, and at least partially on top of another of the plurality of pre-packaged chips.

In Example 39, the subject-matter of any of Examples 26 to 38 may optionally include that the fourth metal layer includes a first portion that is electrically contacted to the at least one electrical bottom contact, and a second portion that is electrically contacted to the electrical connection from the third metal layer to the fourth metal layer, and that the first portion is electrically isolated from the second portion.

In Example 40, the subject-matter of any of Examples 24 to 39 may optionally include arranging the chip in a first opening of a first carrier.

In Example 41, the subject-matter of any of Examples 26 to 40 may optionally include arranging the pre-packaged chip in a second opening of a second carrier.

Example 42 is a semiconductor package including a pre-packaged chip including a chip having at least one electrical top contact at a top side of the chip and at least one electrical bottom contact at a bottom side opposite the top side, a first laminate layer on the top side, a second laminate layer on the bottom side, wherein the first laminate layer and the second laminate layer are laminated together to sandwich the chip therebetween, a first metal layer on the first laminate layer and electrically contacted to the at least one electrical top contact via at least one top contact hole through the first laminate layer, and a second metal layer on the second laminate layer and electrically contacted to the at least one electrical bottom contact via at least one bottom contact hole through the second laminate layer, a carrier having an opening, wherein the pre-packaged chip is arranged inside the opening, a metal layer and a laminate layer, wherein the metal layer is exposed in the opening and electrically conductively connected to the pre-packaged chip, wherein the pre-packaged chip is arranged in the opening in such a way that its upper surface is flush with an upper surface of a surrounding portion of the semiconductor package.

In Example 43, the subject matter of Example 42 may additionally include further electronic components mounted on and electrically connected to the pre-packaged chip.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor package, comprising:
    a pre-packaged chip comprising a chip having at least one electrical top contact at a top side of the chip and at least one electrical bottom contact at a bottom side opposite the top side, a first laminate layer on the top side, a second laminate layer on the bottom side, the first laminate layer and the second laminate layer being laminated together to sandwich the chip therebetween, a first metal layer on the first laminate layer and electrically contacted to the at least one electrical top contact via at least one top contact hole through the first laminate layer, and a second metal layer on the second laminate layer and electrically contacted to the at least one electrical bottom contact via at least one bottom contact hole through the second laminate layer;
    a third laminate layer over the first metal layer on the top side of the chip;
    a fourth laminate layer over the second metal layer on the bottom side of the chip, wherein the third laminate layer and the fourth laminate layer are laminated together to sandwich the pre-packaged chip therebetween;
    a third metal layer on the third laminate layer and electrically contacted to the at least one electrical top contact via at least one further top contact hole through the third laminate layer and the at least one top contact hole through the first laminate layer;
    a fourth metal layer on the fourth laminate layer and electrically contacted to the at least one electrical bottom contact via at least one further bottom contact hole through the fourth laminate layer and the at least one bottom contact hole through the second laminate layer;
    an electrical connection from the third metal layer to the fourth metal layer via a contact hole extending from the third metal layer to the fourth metal layer;
    at least one further pre-packaged chip embedded in the semiconductor package and comprising a further chip having at least one electrical top contact at a top side of the chip and at least one electrical bottom contact at a bottom side opposite the top side, a further first laminate layer on the top side, a further second laminate layer on the bottom side, the further first laminate layer and the further second laminate layer being laminated together to sandwich the further chip therebetween, a further first metal layer on the further first laminate layer and electrically contacted to the at least one electrical top contact via at least one top contact hole through the further first laminate layer, and a further second metal layer on the second laminate layer and electrically contacted to the at least one electrical bottom contact via at least one bottom contact hole through the further second laminate layer; and
    a second carrier comprising a second opening, wherein the pre-packaged chip is arranged in the second opening.

2. The semiconductor package of claim 1, wherein the further first metal layer is electrically contacted to the third metal layer and/or the further second metal layer is electrically contacted to the fourth metal layer.

3. The semiconductor package of claim 1, wherein the pre-packaged chip and the at least one further pre-packaged chip are arranged, in a top view of the semiconductor package, side-by-side.

4. The semiconductor package of claim 1, wherein the pre-packaged chip and the at least one further pre-packaged chip are arranged, in a top view of the semiconductor package, one at least partially on top of the other.

5. The semiconductor package of claim 1, wherein the at least one further pre-packaged chip comprises a plurality of further pre-packaged chips, and wherein the pre-packaged chip and one of the plurality of further pre-packaged chips are arranged, in a top view of the semiconductor package, side-by-side, and at least partially on top of another of the plurality of further pre-packaged chips.

6. The semiconductor package of claim 1, wherein the fourth metal layer comprises a first portion that is electrically contacted to the at least one electrical bottom contact, and a second portion that is electrically contacted to the electrical connection from the third metal layer to the fourth metal layer, and wherein the first portion is electrically isolated from the second portion.

7. A method of manufacturing a semiconductor package, the method comprising:
   forming a pre-packaged chip, comprising:
      laminating a first laminate layer and a second laminate layer together, thereby sandwiching a chip having at least one electrical top contact at a top side of the chip and at least one electrical bottom contact at a bottom side opposite the top side;
      forming at least one top contact hole through the first laminate layer;
      forming a first metal layer on the first laminate layer and electrically contacting the first metal layer to the at least one electrical top contact via the top contact hole;
      forming at least one bottom contact hole through the second laminate layer;
      forming a second metal layer on the second laminate layer and electrically contacting the second metal layer to the at least one electrical bottom contact via at least one bottom contact hole;
   laminating a third laminate layer over the first metal layer on the top side of the chip and a fourth laminate layer over the second metal layer on the bottom side of the chip together to sandwich the pre-packaged chip therebetween;
   forming at least one further top contact hole through the third laminate layer;
   forming a third metal layer on the third laminate layer electrically contacting the at least one electrical top contact via the at least one further top contact hole and the at least one top contact hole;
   forming a fourth metal layer on the fourth laminate layer electrically contacting the at least one electrical bottom contact via the at least one further bottom contact hole and the at least one bottom contact hole;
   forming an electrical connection from the third metal layer to the fourth metal layer via a contact hole extending from the third metal layer to the fourth metal layer;
   embedding at least one further pre-packaged chip in the semiconductor package, the further pre-packaged chip comprising:
      a further chip having at least one electrical top contact at a top side of the chip and at least one electrical bottom contact at a bottom side opposite the top side;
      a further first laminate layer on the top side;
      a further second laminate layer on the bottom side;
      wherein the further first laminate layer and the further second laminate layer are laminated together to sandwich the further chip therebetween;
      a further first metal layer on the further first laminate layer and electrically contacted to the at least one electrical top contact via at least one top contact hole through the further first laminate layer;
      a further second metal layer on the second laminate layer and electrically contacted to the at least one electrical bottom contact via at least one bottom contact hole through the further second laminate layer,
   wherein the method further comprises arranging the pre-packaged chip in a first opening of a first carrier.

8. The method of claim 7, further comprising:
   electrically contacting the further first metal layer to the fourth metal layer and/or electrically contacting the further second metal layer to the third metal layer.

9. The method of claim 7, wherein the pre-packaged chip and the at least one further pre-packaged chip are arranged, in a top view of the semiconductor package, side-by-side.

10. The method of claim 7, wherein the pre-packaged chip and the at least one further pre-packaged chip are arranged, in a top view of the semiconductor package, one at least partially on top of the other.

11. The method of claim 7, wherein the at least one further pre-packaged chip comprises a plurality of further pre-packaged chips, and wherein the pre-packaged chip and one of the plurality of further pre-packaged chips are arranged, in a top view of the semiconductor package, side-by-side, and at least partially on top of another of the plurality of further pre-packaged chips.

* * * * *